(12) United States Patent
Bower et al.

(10) Patent No.: US 9,865,600 B2
(45) Date of Patent: Jan. 9, 2018

(54) PRINTED CAPACITORS

(71) Applicant: X-Celeprint Limited, Cork (IE)

(72) Inventors: Christopher Bower, Raleigh, NC (US); Matthew Meitl, Durham, NC (US); Ronald S. Cok, Rochester, NY (US)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 0 days.

(21) Appl. No.: 15/225,964

(22) Filed: Aug. 2, 2016

(65) Prior Publication Data

US 2017/0141115 A1    May 18, 2017

Related U.S. Application Data

(63) Continuation-in-part of application No. 14/743,770, filed on Jun. 18, 2015.

(60) Provisional application No. 62/014,074, filed on Jun. 18, 2014, provisional application No. 62/014,079, filed on Jun. 18, 2014.

(51) Int. Cl.
*H01L 27/10* (2006.01)
*H01L 49/02* (2006.01)
*H01Q 1/22* (2006.01)
*H01Q 21/06* (2006.01)
(Continued)

(52) U.S. Cl.
CPC ........ *H01L 27/101* (2013.01); *H01L 27/0805* (2013.01); *H01L 27/0811* (2013.01); *H01L 28/40* (2013.01); *H01L 28/60* (2013.01); *H01L 28/82* (2013.01); *H01L 28/86* (2013.01); *H01L 28/87* (2013.01); *H01L 28/90* (2013.01); *H01L 28/91* (2013.01); *H01Q 1/2283* (2013.01); *H01Q 21/0093* (2013.01); *H01Q 21/065* (2013.01)

(58) Field of Classification Search
None
See application file for complete search history.

(56) References Cited

U.S. PATENT DOCUMENTS 5,621,555 A    4/1997 Park
5,815,303 A    9/1998 Berlin
(Continued)

FOREIGN PATENT DOCUMENTS

WO    WO-2008/103931 A2    8/2008
WO    WO-2010/132552 A1    11/2010

OTHER PUBLICATIONS

Partial International Search Report, PCT/EP2015/063708, Oct. 15, 2015.
(Continued)

*Primary Examiner* — Minh-Loan Tran
(74) *Attorney, Agent, or Firm* — William R. Haulbrook; Alexander D. Augst; Choate, Hall & Stewart LLP

(57) ABSTRACT

A device comprises a destination substrate; a multilayer structure on the destination substrate, wherein the multilayer structure comprises a plurality of printed capacitors stacked on top of each other with an offset between each capacitor along at least one edge of the capacitors; and wherein each printed capacitor includes a plurality of electrically connected capacitors. Each printed capacitor of the plurality of printed capacitors can be a horizontal or a vertical capacitor. Each printed capacitor can include a plurality of capacitor layers, each capacitor layer including a plurality of electrically connected capacitors.

18 Claims, 21 Drawing Sheets

(51) Int. Cl.
*H01Q 21/00* (2006.01)
*H01L 27/08* (2006.01)

(56) References Cited

U.S. PATENT DOCUMENTS

| | | | |
|---|---|---|---|
| 6,278,242 | B1 | 8/2001 | Cok et al. |
| 6,326,261 | B1 | 12/2001 | Tsang et al. |
| 6,577,367 | B2 | 6/2003 | Kim |
| 6,717,560 | B2 | 4/2004 | Cok et al. |
| 6,756,576 | B1 | 6/2004 | McElroy et al. |
| 6,933,532 | B2 | 8/2005 | Arnold et al. |
| 7,050,291 | B2 * | 5/2006 | Narendra ............... H01G 9/155 |
| | | | 257/532 |
| 7,129,457 | B2 | 10/2006 | McElroy et al. |
| 7,195,733 | B2 | 3/2007 | Rogers et al. |
| 7,288,753 | B2 | 10/2007 | Cok |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,622,367 | B1 | 11/2009 | Nuzzo et al. |
| 7,662,545 | B2 | 2/2010 | Nuzzo et al. |
| 7,704,684 | B2 | 4/2010 | Rogers et al. |
| 7,799,699 | B2 | 9/2010 | Nuzzo et al. |
| 7,816,856 | B2 | 10/2010 | Cok et al. |
| 7,893,612 | B2 | 2/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,972,875 | B2 | 7/2011 | Rogers et al. |
| 7,982,296 | B2 | 7/2011 | Nuzzo et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,198,621 | B2 | 6/2012 | Rogers et al. |
| 8,207,547 | B2 | 6/2012 | Lin |
| 8,261,660 | B2 | 9/2012 | Menard |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,854,294 | B2 | 10/2014 | Sakariya |
| 8,877,648 | B2 | 11/2014 | Bower et al. |
| 8,889,485 | B2 | 11/2014 | Bower |
| 8,895,406 | B2 | 11/2014 | Rogers et al. |
| 8,987,765 | B2 | 3/2015 | Bibl et al. |
| 2006/0006496 | A1 * | 1/2006 | Harris ................. H01L 23/5223 |
| | | | 257/532 |
| 2010/0248484 | A1 | 9/2010 | Bower et al. |
| 2012/0228669 | A1 | 9/2012 | Bower et al. |
| 2012/0249394 | A1 | 10/2012 | Rofougaran et al. |
| 2012/0257324 | A1 * | 10/2012 | Ma ........................ C04B 35/491 |
| | | | 361/301.4 |
| 2012/0313241 | A1 * | 12/2012 | Bower .................. H01L 21/563 |
| | | | 257/737 |
| 2012/0314388 | A1 | 12/2012 | Bower et al. |
| 2013/0069275 | A1 | 3/2013 | Menard et al. |
| 2013/0088416 | A1 | 4/2013 | Smith et al. |
| 2013/0196474 | A1 | 8/2013 | Meitl et al. |
| 2013/0207964 | A1 | 8/2013 | Fleck et al. |
| 2013/0221355 | A1 | 8/2013 | Bower et al. |
| 2013/0273695 | A1 | 10/2013 | Menard et al. |
| 2014/0104243 | A1 | 4/2014 | Sakariya et al. |
| 2014/0264763 | A1 | 9/2014 | Meitl et al. |
| 2014/0267683 | A1 | 9/2014 | Bibl et al. |
| 2014/0367633 | A1 | 12/2014 | Bibl et al. |
| 2015/0135525 | A1 | 5/2015 | Bower |
| 2015/0137153 | A1 | 5/2015 | Bibl et al. |
| 2015/0372393 | A1 | 12/2015 | Bower et al. |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

* cited by examiner

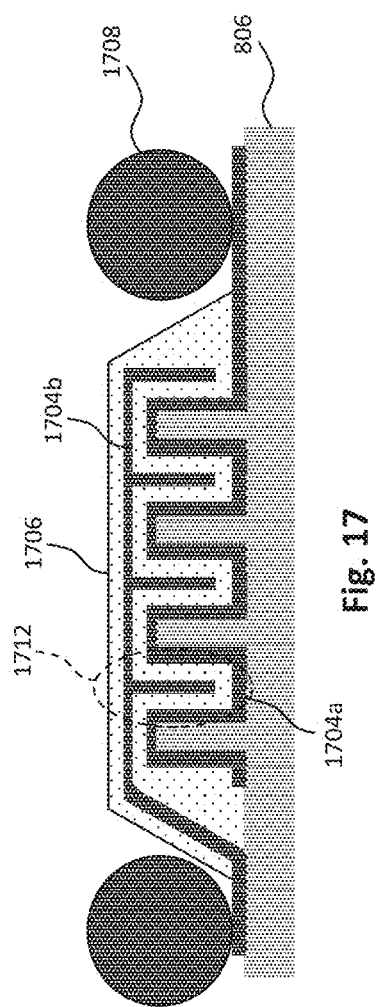
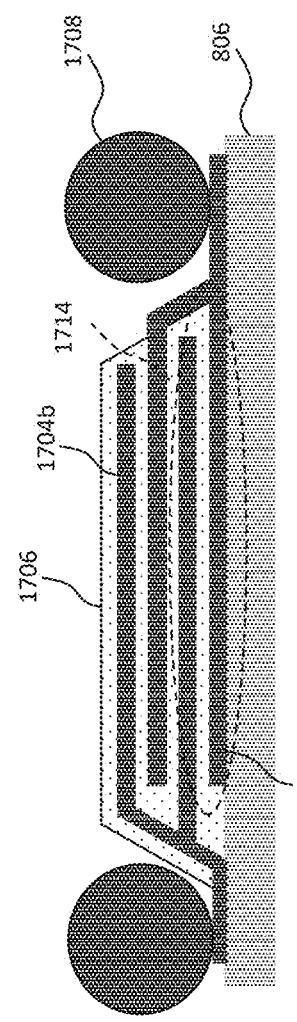

PRINTED CAPACITORS

RELATED APPLICATIONS

This application is a continuation-in-part of U.S. patent application Ser. No. 14/743,770, filed Jun. 18, 2015, entitled "Micro Assembled High Frequency Devices and Arrays," which claims priority to and the benefit of U.S. Provisional Patent Application No. 62/014,074, filed Jun. 18, 2014, entitled "Micro Assembled High Frequency Devices and Arrays," and U.S. Provisional Patent Application No. 62/014,079, filed Jun. 18, 2014, entitled "System and Methods for Providing Micro Assembled Devices," the contents of each of which are incorporated by reference herein in their entirety.

FIELD OF THE INVENTION

The present invention relates to micro-assembled, for example using micro transfer printing technology, high frequency devices and arrays.

BACKGROUND OF THE INVENTION

A phased array is an array of antennas in which the relative phases of the respective signals supplied to the antennas are used to focus the radiation pattern of the array in a desired direction. The signals provided to the array of antennas enable the array of antennas to achieve improved performance over that of a single antenna. The antenna array can, among other things, increase overall gain, receive or transmit a greater diversity of signals, cancel out interference, steer the radiation pattern in a specific direction, or determine the direction of incoming signals. The phase relationship among the antennas can be fixed to form a tower array.

Alternatively, the phase relationship among the antennas can be adjustable to form a beam-steering array. Beam steering allows the direction of the main lobe of a radiation pattern to be changed using constructive and destructive interference between the electromagnetic signals emitted from the various antennas in the array of antennas. This is typically accomplished by switching the antenna elements or by changing the relative phases of the signals (such as RF signals) driving each of the antenna elements.

An example of a beam-steering array is the Advanced Modular Incoherent Scatter Radar (AMISR) by SRI International of Menlo Park, Calif. AMISR has three separate radar faces, with each face including 128 building-block-like panels over a 30- by 30-meter roughly square surface. AMISR is made up of 4,096 antennas, giving a combined power of up to two megawatts. By controlling the relative phases of the signals coming from the individual antennas, the radar beam can be steered almost instantaneously from one position in the sky to another. This allows the study of rapidly moving features of the atmosphere. Remote operation and electronic beam steering allow researchers to operate and position the radar beam to accurately measure rapidly changing space weather events. However, AMISR is roughly the size of a football field.

Phased-array radar systems are also used by the navy in ships as the phased-array radars allow the ships to use a single radar system for surface detection and tracking, finding other ships, and air detection and tracking. Shipborne phased-array radar systems can use beam steering to track many targets simultaneously while also controlling several in-flight missiles.

Phased-array antenna systems benefits from a large number of radiating elements. The use of more radiating elements enables sharper and narrower beams that provide higher gain. However, as the number of radiating elements increases, the size of the system and the cost of assembly likewise increases, limiting the application of phased-array antenna systems, especially for consumer products. While many applications do exist for phased-array radars, relatively few have been explored since the size and cost of phased-array radars are prohibitive for many applications.

Among other things, as the size of the components shrinks, the difficulty of arranging a plurality of diverse elements increases. Semiconductor chip- or die-automated assembly equipment typically uses vacuum-operated placement heads, such as vacuum grippers or pick-and-place tools, to pick up and apply devices to a substrate. It is often difficult to pick up and place ultra-thin and/or small devices using this technology.

Some electronic devices are difficult to construct by conventional assembly techniques due to their ultra-thin and/or small dimensions. For example, some electronic devices (e.g., micro-integrated circuits) can be less than 0.1 mm in one lateral dimension. Moreover, some electronic devices benefit from a large number of radiating elements (e.g., phased-array radars incorporating more radiating elements can form sharper, narrower beams with higher gain). However, as the number of radiating elements increases, the area needed for the parts and the cost of assembly increases. Furthermore, the spatial distribution of elements such as antennas can result in an inefficient use of area for phased-array antenna systems.

Thus, there is a need for phased-array antenna systems and methods of manufacturing thereof that enable phased-array antenna systems to be packaged into small-scale systems utilizing less semiconductor material than monolithic approaches.

SUMMARY OF THE INVENTION

The disclosed technology provides phased-array antenna systems and methods of manufacturing thereof that enable phased-array antenna systems to be packaged into small-scale systems utilizing less semiconductor material than monolithic approaches. In some embodiments, the density of active components on the phased-array antenna system is small (e.g., 5% or less). In other embodiments, depending on the application, the active components can be densely packed on a destination substrate. Micro assembly provides a way to efficiently use semiconductor material in a phased array, reducing the amount of non-active semiconductor area (e.g., the area on the semiconductor material that does not include transistors, diodes, or other active components). Moreover, high-throughput micro assembly (e.g. by micro transfer printing) mitigates costs associated with large part counts and allows small, micro-scale devices in some embodiments to be accurately arranged into larger systems.

Micro transfer printing permits the selection and application of ultra-thin, fragile, or small devices without cause damage to the devices themselves. Micro-structured stamps can be used to pick up micro devices, transport the micro devices to a destination substrate, and print the micro devices onto the destination substrate. Surface adhesion forces are used to control the selection and printing of these devices onto the destination substrate. This process can be performed in massive parallel. The stamps can be designed to transfer hundreds to thousands of discrete structures in a single pick-up-and-print operation.

Micro transfer printing also enables parallel assembly of high-performance semiconductor devices onto virtually any substrate material, for example, glass, plastics, metals, or semiconductors. The substrates can be flexible, thereby permitting the production of flexible electronic devices. Flexible substrates can be integrated in a large number of configurations, for example, configurations not possible with brittle silicon-based electronic devices. Additionally, plastic substrates, for example, are mechanically rugged and can be used to provide electronic devices that are less susceptible to damage or electronic performance degradation caused by mechanical stress. Thus, these materials can be used to fabricate electronic devices by continuous, high-speed printing techniques capable of generating electronic devices over large substrate areas at low cost (e.g., roll-to-roll manufacturing).

Moreover, these micro transfer printing techniques can be used to print semiconductor devices at temperatures compatible with assembly on plastic polymer substrates. In addition, semiconductor materials can be printed onto large areas of substrates thereby enabling continuous, high-speed printing of complex integrated electrical circuits over large substrate areas. Furthermore, fully flexible electronic devices with good electronic performance in flexed or deformed device orientations can be provided to enable a wide range of flexible electronic devices.

In one aspect, the invention is directed to a method of forming a phased-array antenna structure using printed micro assembled active components, the method comprising: providing a plurality of antennas on a destination substrate; forming a plurality of amplifiers on a first substrate; forming a plurality of phase-control devices on a second substrate; contacting the first substrate with an etchant, thereby removing at least one of a portion of a first sacrificial layer underneath the plurality of amplifiers and forming a plurality of printable amplifiers, each printable amplifier connected to the first substrate by one or more tethers; contacting the second substrate with an etchant, thereby removing at least one of a portion of a second sacrificial layer underneath the plurality of phase-control devices and forming a plurality of printable phase-control devices, each printable phase-control device connected to the second substrate by one or more tethers; exposing at least a portion of the plurality of printable amplifiers and plurality of printable phase-control devices to chemical agents for conditioning or processing the newly exposed surfaces of the plurality of printable amplifiers and plurality of printable phase-control devices; and transferring, by micro assembly, at least a portion of the plurality of printable amplifiers and plurality of printable phase-control devices to the destination substrate and electrically interconnecting the antennas, the amplifiers, and the phase-control devices, to thereby form a phased-array antenna system using an array of high-frequency micro-scale devices from multiple source wafers.

In certain embodiments, transferring at least a portion of the plurality of printable amplifiers and plurality of printable phase-control devices to a destination substrate comprises: contacting the portion of the plurality of printable amplifiers with a transfer device, wherein contact between the transfer device and the portion of the plurality of printable amplifiers temporarily binds the portion of the plurality of printable amplifiers to the transfer device; contacting the portion of the plurality of printable amplifiers disposed on the transfer device with the receiving surface of the destination substrate; separating the transfer device from the portion of the plurality of printable amplifiers, thereby transferring the portion of the plurality of printable amplifiers onto the destination substrate; contacting the portion of the plurality of printable phase-control devices with a transfer device, wherein contact between the transfer device and the portion of the plurality of printable phase-control devices temporarily binds the portion of the plurality of printable phase-control devices to the transfer device; contacting the portion of the plurality of printable phase-control devices disposed on the transfer device with the receiving surface of the destination substrate; and separating the transfer device from the portion of the plurality of printable phase-control devices, thereby transferring the portion of the plurality of printable phase-control devices onto the destination substrate.

In certain embodiments, the plurality of antennas comprise a plurality of patch antennas.

In certain embodiments, the method further comprises: forming anchoring structures and tethering structures in each of the native substrates, such that the released or releasable structures are connected to their respective native substrates by the anchoring structures or tethering structures following contact of each of the native substrates with the etchant.

In certain embodiments, the method further comprises: forming anchoring or tethering structures from non-epitaxial materials such that the released or releasable structures are connected to their respective native substrate by the anchoring structures or tethering structures following contact of the substrate with the etchant.

In certain embodiments, the method further comprises: forming one or more encapsulating structures to encapsulate at least a portion of the released or releasable structure.

In certain embodiments, the first sacrificial layer comprises a portion of the first substrate. In certain embodiments, the second sacrificial layer comprises a portion of the second substrate. In certain embodiments, the chemical etch gains access to the sacrificial layer through points of ingress formed in the one or more tethers.

In certain embodiments, the chemical etch exits the space formerly occupied by at least a portion of the sacrificial layer through points of egress in the one or more tethers.

In certain embodiments, the points of egress are the same as the points of ingress.

In certain embodiments, the destination substrate is a member selected from the group consisting of polymer, plastic, resin, polyimide, PEN, PET, metal, metal foil, glass, a semiconductor, and sapphire. In certain embodiments, the destination substrate has a transparency greater than or equal to 50%, 80%, 90%, or 95% for visible light.

In another aspect, the invention is directed to a device comprising: a destination substrate; and a multilayer structure on the destination substrate, wherein the multilayer structure comprises a plurality of printed capacitors stacked on top of each other with an offset between each capacitor along at least one edge of the capacitors.

In certain embodiments, the offset is in one dimension. In certain embodiments, the offset is in two dimensions. In certain embodiments, the offset is such that a portion of a top surface of each capacitor is exposed.

In certain embodiments, each capacitor of the plurality of capacitors has a capacitance between 100 $nF/mm^2$ and 400 $nF/mm^2$. In certain embodiments, each capacitor of the plurality of capacitors has a thickness of from 1 µm to 10 µm, 10 µm to 30 µm, 30 µm to 50 µm, or 50 µm to 100 µm. In certain embodiments, each capacitor of the plurality of capacitors has a width of from 10 µm to 50 µm, 50 µm to 100 µm, or 100 µm to 200 µm. In certain embodiments, each capacitor of the plurality of capacitors has a length of from 10 μm to 50 μm, 50 μm to 100 μm, or 100 μm to 200 μm. In certain embodiments, the plurality of capacitors are a same shape and size.

In certain embodiments, the plurality of printed capacitors are connected in at least one of parallel or series.

In certain embodiments, each printed capacitors include a plurality of electrically connected capacitors. The capacitors can be horizontal or vertical capacitors and the printed capacitors can each included a plurality of capacitor layers.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a transparency greater than or equal to 50%, 80%, 90%, or 95% for visible light.

In another aspect, the invention is directed to a wafer of printable capacitors, the wafer comprising: a source substrate; a first sacrificial layer on a process side of the source substrate; a first set of printable capacitors on the first sacrificial layer; a second sacrificial layer on the first set of printable capacitors; and a second set of printable capacitors on the second sacrificial layer.

In certain embodiments, each printable capacitor of the second set of printable capacitors is disposed above a printable capacitor of the first set of printable capacitors. In certain embodiments, each of the first and second sets of printable capacitors forms an array of capacitors. In certain embodiments, the density of each of the first and second sets of printable capacitors is 5 to 15 capacitors per square millimeter.

In certain embodiments, each capacitor of the plurality of capacitors has a thin metal-insulator-metal structure with a thickness of from 1 μm to 10 μm, 10 μm to 30 μm, 30 μm to 50 μm, or 50 μm to 100 μm. In certain embodiments, each capacitor of the plurality of capacitors has a width of from 10 μm to 50 μm, 50 μm to 100 μm, or 100 μm to 200 μm. In certain embodiments, each capacitor of the plurality of capacitors has a length of from 10 μm to 50 μm, 50 μm to 100 μm, or 100 μm to 200 μm.

In certain embodiments, each of the first and second sacrificial layers comprises at least one member selected from the group consisting of SiN, $SiO_2$, and Si.

In certain embodiments, the substrate is a member selected from the group consisting of: glass, sapphire, $Al_2O_x$, gallium arsenide, gallium nitride, silicon, and germanium, silicon carbide, plastic, silicon wafer, silicon on insulator wafer, polycrystalline silicon wafer, GaAs wafer, silicon on substrate wafer, germanium wafer, thin films of polycrystalline silicon wafer, and silicon wafer.

In certain embodiments, each capacitor of the plurality of printable capacitors has a capacitance from 100 $nF/mm^2$ to 400 $nF/mm^2$. In certain embodiments, each of the plurality of printable capacitors have a same shape and size.

In another aspect, the invention is directed to a method for assembling a plurality of capacitors on a receiving surface of a substrate, the method comprising: contacting a first capacitor of the plurality of capacitors with a transfer device having a contact surface, thereby temporarily binding the capacitor to the contact surface such that the contact surface has the capacitor temporarily disposed thereon; contacting the first capacitor disposed on the contact surface of the transfer device with the receiving surface of the substrate; separating the contact surface of the transfer device and the capacitor, wherein the capacitor is transferred onto the receiving surface, thereby assembling the capacitor on the receiving surface of the substrate; contacting a second capacitor of the plurality of capacitors with the transfer device, thereby binding the second capacitor to the contact surface such that the contact surface has the second capacitor disposed thereon; contacting the second capacitor disposed on the contact surface of the transfer device with a surface of the first capacitor assembled on the receiving surface of the substrate; and separating the contact surface of the transfer device and the second capacitor, wherein the second capacitor is transferred onto the capacitor assembled on the receiving surface of the substrate, thereby assembling the second capacitor on the capacitor assembled on the receiving surface of the substrate.

In certain embodiments, the second capacitor is offset from the first capacitor. In certain embodiments, the offset is in one dimension. In certain embodiments, the offset is in two dimensions. In certain embodiments, the offset is such that a portion of the top surface of each capacitor is exposed. In certain embodiments, each capacitor of the plurality of capacitors has a capacitance from 100 $nF/mm^2$ to 400 $nF/mm^2$. In certain embodiments, the plurality of capacitors are a same shape and size. In certain embodiments, each capacitor of the plurality of capacitors has a thin metal-insulator-metal structure with a thickness of from 1 μm to 10 μm, 10 μm to 30 μm, 30 μm to 50 μm, or 50 μm to 100 μm. In certain embodiments, each capacitor of the plurality of capacitors has a width of from 10 μm to 50 μm, 50 μm to 100 μm, or 100 μm to 200 μm. In certain embodiments, each capacitor of the plurality of capacitors has a length of from 10 μm to 50 μm, 50 μm to 100 μm, or 100 μm to 200 μm.

In certain embodiments, the first capacitor and the second capacitor are electrically connected via thin-film wafer-level interconnections.

In certain embodiments, the first capacitor and the second capacitor are connected in parallel. In certain embodiments, the first capacitor and the second capacitor are connected in series. In certain embodiments, the first capacitor is electrically connected via thin-film wafer-level interconnections. In certain embodiments, the first capacitor disposed on the transfer device is contacted with a region of the receiving surface with a placement accuracy greater than or equal to 25 microns.

In certain embodiments, an adhesive layer is provided on the receiving surface, wherein the first capacitor is contacted with the adhesive layer during transfer of the capacitor to the receiving surface of the substrate.

In certain embodiments, the transfer device comprises a conformable transfer device. In certain embodiments, the transfer device comprises an elastomeric stamp.

In certain embodiments, contacting the first capacitor disposed on the transfer device with the receiving surface of the substrate is performed at a temperature of less than 400° C.

The disclosed technology, in certain embodiments, relates to providing phased arrays of antennas using driven with printable micro-scale active components. In certain embodiments, the disclosed technology includes a phased array of individual radio frequency (RF) or microwave components, each element including a patch antenna, a printed (e.g., micro transfer printed) amplifier, and a printed phase-control device. In certain embodiments, the printable devices have a width, length, or height (e.g., or two or three dimensions) of from 2 to 5 μm, 5 to 10 μm, 10 to 20 μm, or 20 to 50 μm. Control elements can have a wide range of sizes depending on the circuit complexity, integration technology, and design rules. For example, control elements can have dimensions in the tens to hundreds of microns and areas of 50 to 50,000 square microns, or even larger. The control elements can be interlaced within the array of micro assembled micro-scale active radio frequency components or within the array of antennas.

The disclosed technology, in certain embodiments, includes a method of preparing released or releasable heterogeneously integrated monolithic microwave integrated circuits. The method can include: forming a diverse set of two or more devices (e.g., the set comprising two or more different kinds of devices) on respective native substrates (e.g., in and/or with an epitaxial material deposited on the first native substrate by the addition and/or patterning of dielectric and/or conductive thin-film materials; e.g., SiGe, GaN, GaAs, InP, CMOS) (e.g., in an area-dense configuration on their native substrates, with each area-dense configuration supplying components for a much larger area device on a non-native destination substrate); delineating releasable structures on the native substrates, partially exposing the native substrates; contacting each of the native substrates (e.g., and the devices included thereon) with an etchant (e.g. heated tetramethyl ammonium hydroxide or potassium hydroxide, or sodium hydroxide or other basic solution for performing anisotropic silicon etch), thereby removing at least one of a portion of the substrate material and a sacrificial layer underneath the structures and forming released or releasable (e.g., connected to the substrate via tethers), micro assemble-able materials and/or devices (e.g., an array of devices); optionally, exposing each of the native substrates and the released or releasable structures (e.g., connected to the substrate by anchoring structures and/or tethering structures) to chemical agents for conditioning or processing the newly exposed surface of the released structures (e.g., to impart surface roughness by exposure to heated phosphoric acid); and transferring, by micro assembly, the diverse set of two or more devices to a non-native destination substrate (e.g., non-native to some or all of the components of the integrated circuit; e.g., and including one or more of aluminum oxide ceramic, aluminum nitride ceramic, silicon nitride ceramic, sapphire, glass, diamond, diamond-like carbon, silicon, beryllium oxide, glass-resin composite, or copper), thereby producing an array of high frequency diverse integrated circuits from multiple source wafers on a different, non-native destination substrate that supports the diverse set. The integrated circuits can include integrated circuits that process or control high-frequency or radio-frequency signals.

The diverse set of two or more devices can include at least one of: a heterojunction bipolar transistors at least partially formed on gallium arsenide or indium phosphide substrates and transferred to the non-native destination substrate; high electron-mobility transistors based on GaAs, InP, or GaN related materials at least partially formed on their native substrates and transferred to the native destination substrate; SiGe transistors at least partially formed on silicon-on-insulator substrates and transferred to their non-native destination substrates; and diodes, passive components, and signal-processing integrated circuits, at least partially formed on their native substrates, for example silicon or silicon-on-insulator wafers, and transferred to the non-native destination substrate.

The disclosed technology, in certain embodiments, includes a method of preparing released or releasable transistors. The method can includes: forming transistors (e.g., RF transistors, heterojunction bipolar transistors and/or high-electron mobility transistors) on a release layer with selective etching characteristics that allow the release layer to be chemically removed chemically, at least partially separating the releasable device from a native substrate (e.g., GaAs or InP); forming anchoring structures and/or tethering structures (e.g., comprising photodefinable materials, photoresist materials, epoxies, polyimides, dielectrics, metals, and/or semiconductors; e.g., or made from photoresist material that also encapsulates the transistors from the chemistries used in the release process) on the native substrate, such that the released or releasable structures are connected to the native substrate by the anchoring structures and/or tethering structures following contact of the native substrate with the etchant, thereby maintaining the spatial configuration of the transistors through the release process; after formation of the anchoring, tethering, and/or encapsulation structures, removing the release layer by chemically etching, thereby at least partially releasing the transistors such that the transistors are ready for retrieval removal by a transfer element; contacting a transfer element (e.g., that is made at least in part of a conformable material, for example, PDMS rubber, such that the transfer element makes intimate contact with at least a portion of the topography of the releasable object) to the transistors and adhering the transfer element to at least the partially released transistors; after adhering to the at least partially released transistor, moving the transfer element moves away from the native substrate while, maintaining adhesion to the released object, thereby retrieving, removing, separating, or picking the transistor from its native substrate, wherein the anchor or tether structures fracture and/or lose connection to the native substrate and/or the released object in the process of retrieving and/or moving the transfer element away from the native substrate; and contracting the transistors to the non-native substrate and removing the transfer element, thereby placing the transistor on the non-native substrate.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 17 is a cross-section of a printed capacitor having a plurality of multiple vertical capacitors according to an embodiment of the present disclosure;

FIG. 18 is a cross-section of a printed capacitor having a plurality of multiple horizontal capacitors according to an embodiment of the present disclosure;

Figure 1A:
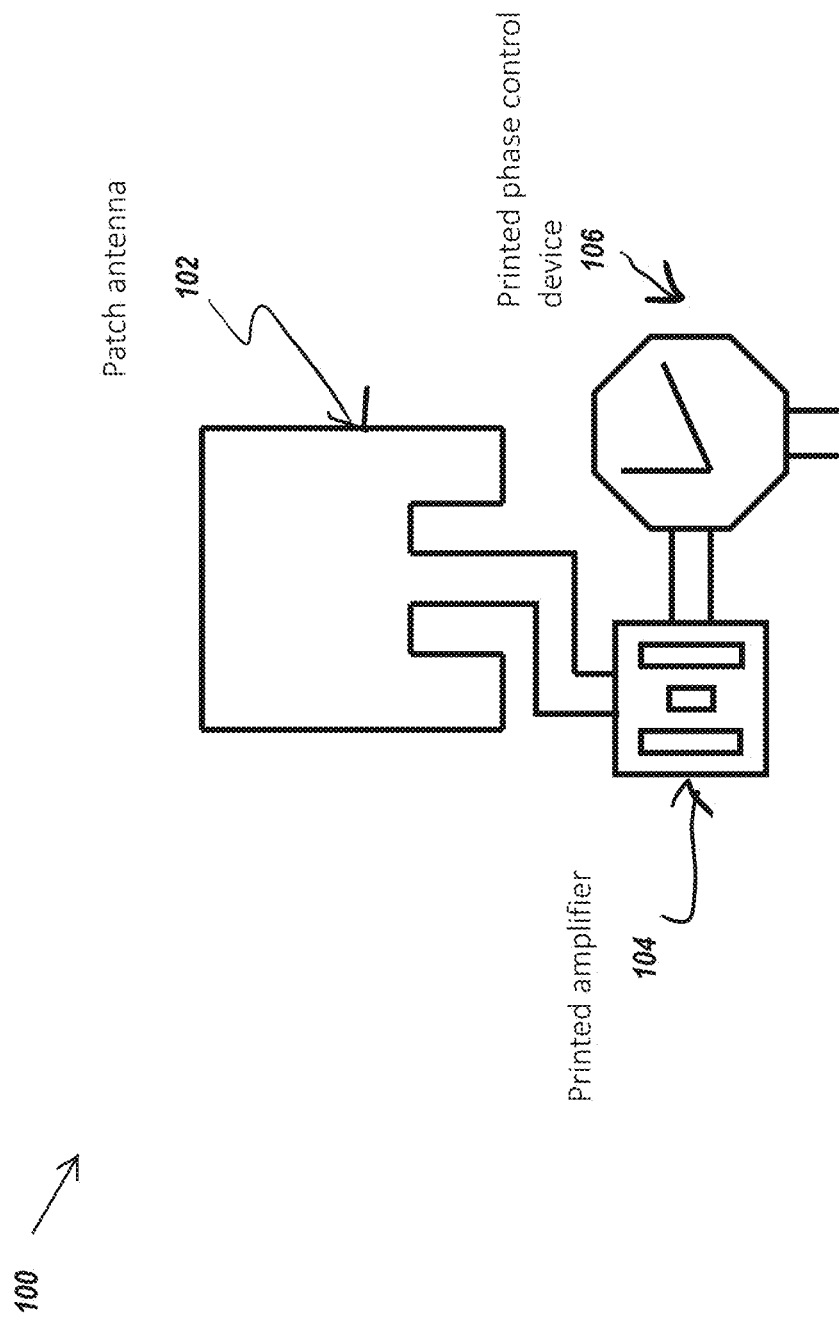
FIG. 1A is a schematic illustration of an individual element for use in a phased array that uses printed active components.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

As used herein the expression "semiconductor element" and "semiconductor structure" are used synonymously and broadly refer to a semiconductor material, structure, device, or component of a device. Semiconductor elements include high-quality single crystalline and polycrystalline semiconductors, semiconductor materials fabricated via high-temperature processing, doped semiconductor materials, organic and inorganic semiconductors, and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light-emitting diodes, lasers, p-n junctions, photodiodes, integrated circuits, and sensors. In addition, semiconductor element can refer to a part or portion that forms an functional semiconductor device or product.

"Semiconductor" refers to any material that is a material that is an insulator at a very low temperature, but which has an appreciable electrical conductivity at temperatures of about 300 Kelvin. The electrical characteristics of a semiconductor can be modified by the addition of impurities or dopants and controlled by the use of electrical fields. In the present description, use of the term semiconductor is intended to be consistent with use of this term in the art of microelectronics and electronic devices. Semiconductors useful in the present invention can include elemental semiconductors, such as silicon, germanium and diamond, and compound semiconductors, for example group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as PbI2, MoS2 and GaSe, oxide semiconductors such as CuO and Cu2O. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light-emitting materials, such as light-emitting diodes (LEDs) and solid-state lasers. Impurities of semiconductor materials are atoms, elements, ions or molecules other than the semiconductor material(s) themselves or any dopants provided in the semiconductor material. Impurities are undesirable materials present in semiconductor materials that can negatively impact the electronic properties of semiconductor materials, and include but are not limited to oxygen, carbon, and metals including heavy metals. Heavy-metal impurities include, but are not limited to, the group of elements between copper and lead on the periodic table, calcium, sodium, and all ions, compounds and/or complexes thereof.

"Substrate" refers to a structure or material on which, or in which, a process is (or has been) conducted, such as patterning, assembly or integration of semiconductor elements. Substrates include, but are not limited to: (i) a structure upon which semiconductor elements are fabricated, deposited, transferred or supported (also referred to as a native substrate); (ii) a device substrate, for example an electronic device substrate; (iii) a donor substrate having elements, such as semiconductor elements, for subsequent transfer, assembly or integration; and (iv) a target substrate for receiving printable structures, such as semiconductor elements. A donor substrate can be, but is not necessarily, a native substrate.

"Destination substrate" as used herein refers to the target substrate (e.g., non-native substrate) for receiving printable structures, such as semiconductor elements. Examples of destination substrate materials include polymer, plastic, resin, polyimide, polyethylene naphthalate, polyethylene terephthalate, metal, metal foil, glass, flexible glass, a semiconductor, and sapphire.

The terms "micro" and "micro-device" as used herein refer to the descriptive size of certain devices or structures in accordance with embodiments of the invention. As used herein, the terms "micro" and "micro-device" are meant to refer to structures or devices on the scale of 0.5 to 250 μm (e.g., from 0.5 to 2 μm, 2 to 5 μm, 5 to 10 μm, 10 to 20 μm, 20 to 50 μm, 20 to 50 μm, 50 to 100 μm, or 100 to 250 μm). However, it is to be appreciated that embodiments of the present invention are not necessarily so limited, and that certain aspects of the embodiments can be applicable to larger or smaller size scales.

As used herein, "micro-LED" refers to an inorganic light-emitting diode on the scale of 0.5 to 250 μm. For example, micro-LEDs can have at least one of a width, length, and height (or two or all three dimensions). Micro-LEDs emit light when energized. The color of the light emitted by an LED varies depending upon the structure of the micro-LED. For example, when energized a red micro-LED emits red light, a green micro-LED emits green light, a blue micro-LED emits blue light, a yellow micro-LED emits yellow light, and a cyan micro-LED emits cyan light.

"Printable" relates to materials, structures, device components, or integrated functional devices that are capable of transfer, assembly, patterning, organizing, or integrating onto or into substrates without exposure of the substrate to high temperatures (i.e. at temperatures less than or equal to about 400, 200, or 150 degrees Celsius). In one embodiment of the present invention, printable materials, elements, device components, or devices are capable of transfer, assembly, patterning, organizing and/or integrating onto or into substrates via solution printing, micro-transfer printing, or dry transfer contact printing.

"Printable semiconductor elements" of the present invention comprise semiconductor structures that can be assembled or integrated onto substrate surfaces, for example by using dry transfer contact printing, micro-transfer printing, or solution printing methods. In one embodiment, printable semiconductor elements of the present invention are unitary single crystalline, polycrystalline or microcrystalline inorganic semiconductor structures. In the context of this description, a unitary structure is a monolithic element having features that are mechanically connected. Semiconductor elements of the present invention can be undoped or doped, can have a selected spatial distribution of dopants and can be doped with a plurality of different dopant materials, including p- and n-type dopants. The present invention includes microstructured printable semiconductor elements having at least one cross-sectional dimension greater than or equal to about 1 micron and nanostructured printable semiconductor elements having at least one cross-sectional dimension less than or equal to about 1 micron. Printable semiconductor elements useful in many applications comprise elements derived from "top down" processing of high-purity bulk materials, such as high-purity crystalline semiconductor wafers generated using conventional high-temperature processing techniques. In one embodiment, printable semiconductor elements of the present invention comprise composite structures having a semiconductor operationally connected to at least one additional device component or structure, such as a conducting layer, dielectric layer, electrode, additional semiconductor structure, or any combination of these. In one embodiment, printable semiconductor elements of the present invention comprise stretchable semiconductor elements or heterogeneous semiconductor elements.

The term "flexible" refers to the ability of a material, structure, device or device component to be reversibly deformed into a curved shape, e.g., without undergoing a transformation that introduces significant strain, such as strain characterizing the failure point of a material, structure, device, or device component.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which can provide desired chemical or physical properties. "Dielectric" and "dielectric material" are used synonymously in the present description and refer to a substance that is highly resistant to flow of electric current and can be polarized by an applied electric field. Useful dielectric materials include, but are not limited to, $SiO_2$, $Ta_2O_5$, $TiO_2$, $ZrO_2$, $Y_2O_3$, $SiN_4$, STO, BST, PLZT, PMN, and PZT.

"Polymer" refers to a molecule comprising a plurality of repeating chemical groups, typically referred to as monomers. Polymers are often characterized by high molecular masses. Polymers useable in the present invention can be organic polymers or inorganic polymers and can be in amorphous, semi-amorphous, crystalline or partially crystalline states. Polymers can comprise monomers having the same chemical composition or can comprise a plurality of monomers having different chemical compositions, such as a copolymer. Cross-linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Micro-transfer printing" as used herein refers to systems, methods, and techniques for the deterministic assembly of micro- and nano-materials, devices, and semiconductor elements into spatially organized, functional arrangements with two-dimensional and three-dimensional layouts. It is often difficult to pick up and place ultra-thin or small devices, however, micro-transfer printing permits the selection and application of these ultra-thin, fragile, or small devices, such as micro-LEDs, without causing damage to the devices themselves. Microstructured stamps (e.g., elastomeric, electrostatic stamps, or hybrid elastomeric/electrostatic stamps) can be used to pick up micro devices, transport the micro devices to a destination substrate, and print the micro devices onto the destination substrate. In some embodiments, surface adhesion forces are used to control the selection and printing of these devices onto the destination substrate. This process can be performed massively in parallel. The stamps can be designed to transfer a single device or hundreds to thousands of discrete structures in a single pick-up-and-print operation. For a discussion of micro-transfer printing generally, see U.S. Pat. Nos. 7,622,367 and 8,506,867, each of which is hereby incorporated by reference in its entirety.

Phased-array antenna systems can be constructed using transfer printed active components. Phased-array antenna systems benefit from a large number of radiating elements (e.g., more radiating elements can-form sharper, narrower beams and provide higher gain). As the number of radiating elements increases, the size of the system and the cost of assembly increases. High-throughput micro assembly (e.g. by micro transfer printing) mitigates costs associated with large part count.

Micro assembly is advantaged over monolithic approaches that form multiple radiating elements on a semiconductor wafer because micro assembly uses less semiconductor material to provide the active components that are necessary for the array. The density of active components on the phased-array antenna system is small (a few % or less). Micro assembly provides a way to efficiently use semiconductor material in a phased-array antenna system, reducing the amount of non-active semiconductor area (e.g., the area on the semiconductor material that does not include transistors, diodes, or other active components) in an original native source substrate. Micro-transfer methods are described in U.S. Pat. Nos. 8,722,458, 7,622,367 and 8,506,867, each of which is hereby incorporated by reference.

In some embodiments, it is advantageous to place active components near each individual antenna in the phased array of antennas. In some embodiments, the cost of each active component is reduced by miniaturizing the active components, for example in an integrated circuit, permitting a greater number of components to be produced on a given semiconductor wafer.

The active components can be released from the native substrate, facilitating thin-film interconnection to the active component and reducing their cost by enabling substrate re-use.

Thin film interconnection to the active component is advantaged in RF applications by providing a reduced parasitic compared to other means of interconnection, including wire bonding and bump bonding.

Phased-array antenna system systems that use transfer-printed micro-assembled active components can be used to provide radar for self-driving cars, power transmission for wireless unmanned vehicles, power transmission for wireless cameras, heating for microwave ovens, power transmission for wireless lighting devices, data transmission, power transmission from handsets and personal computers to auxiliary mobile devices, or power and data transmission to modular information display elements, including bi-stable or multi-stable display elements such as electrophoretic displays. For example, control systems for driverless vehicles benefit from radar with high-gain beam forming capabilities. Micro-assembly provides an economical route to high-gain phased arrays useful in tactical aerospace precision. Advantages of transfer-printed phased arrays include, among other things, monolithic integration & efficient material utilization of best-in-class materials—SiGe, GaN, GaAs, InP, CMOS, etc., and low-inductance interconnection of amplifiers to antennas.

FIG. 1A is an illustration of an individual element 100 for use in a phased antenna array system that includes printed active components. An array of individual elements 100 can be micro assembled onto a substrate to form a phased-array antenna system. In some embodiments, the element 100 includes an antenna 102, such as a patch antenna. Patch antennas can be mounted on a flat surface and have a low profile. The antenna 102 is connected to an amplifier 104 that is micro assembled (e.g., micro transfer printed) onto the substrate. A phase-control device 106 is connected to the amplifier 104 such that the phase of the signal broadcast using the antenna 102 can be controlled. The phase-control device 106 can be integrated with the amplifier 104 in a common device, such as an integrated circuit, or separate, for example in separate integrated circuits.

In some embodiments, the individual elements are formed using compound micro assembly techniques. Compound micro assembly, for example, allows arrays of micro-systems containing small devices (e.g., width, length, and height from 1 micron to 100 microns) to be formed on an intermediate substrate, for example by micro-transfer printing the individual elements from one or more native substrates on which the individual elements are formed to one or more intermediate substrates. The micro-systems on the intermediate substrates can then be micro-transfer printed to the destination substrate to form a macro-system formed of several micro-systems each on its own separate intermediate substrate.

Figure 1B:
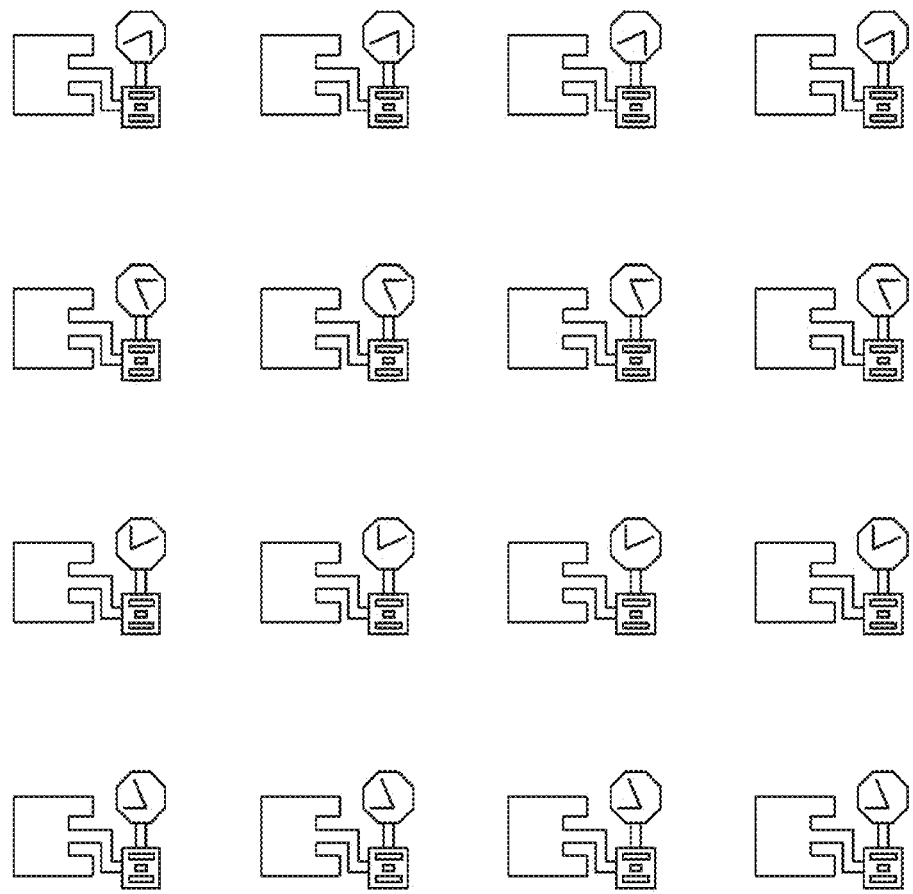
FIG. 1B is a schematic illustration of an example array of 16 printed elements of a phased array that uses printed active components.
Figure 1C:
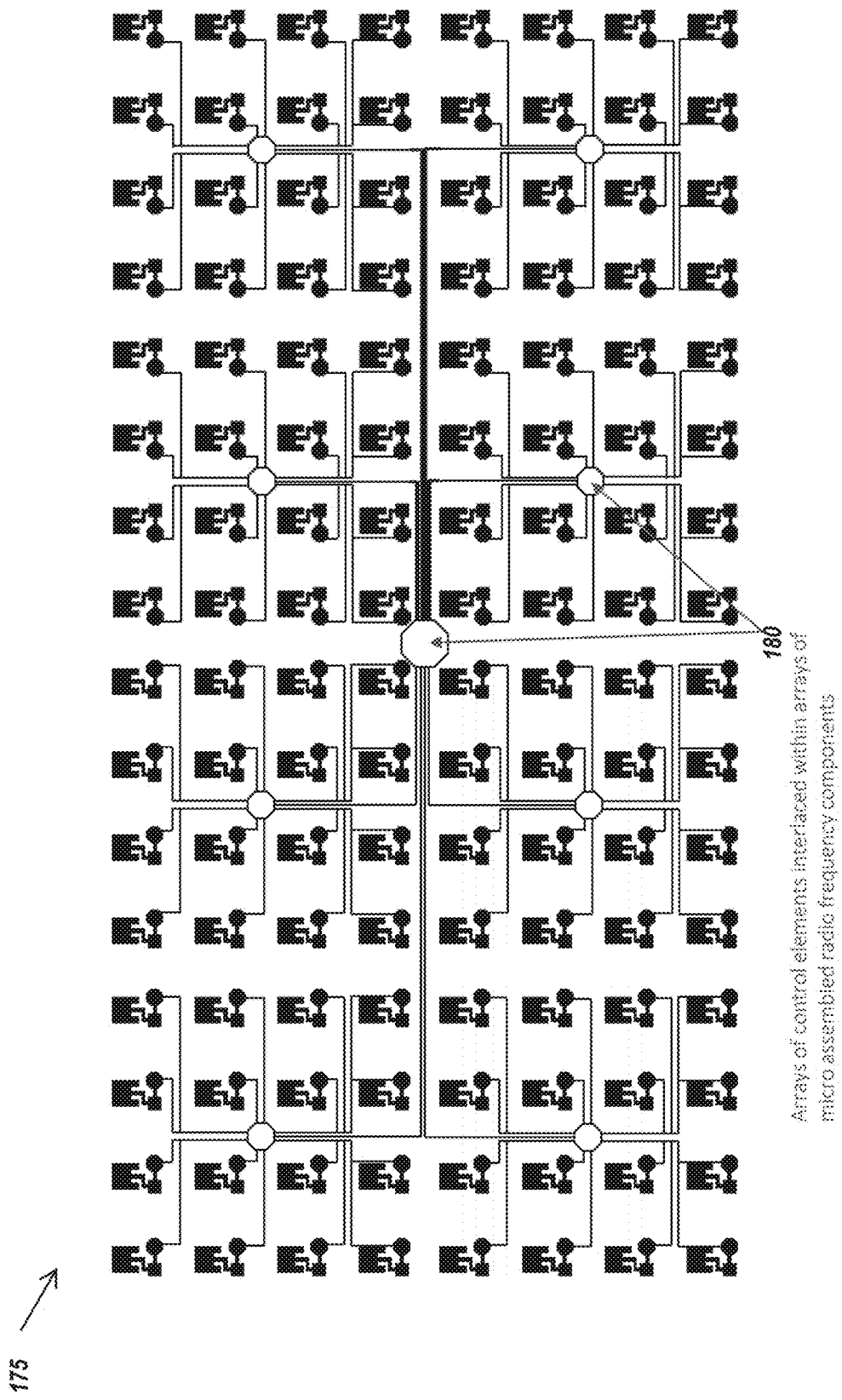
FIG. 1C is a schematic illustration of an example array of 128 printed elements of a phased array that uses printed active components.

FIG. 1B is an illustration of an example array of 16 printed elements of a phased-array antenna 150 that uses printed active components. FIG. 1C is an illustration of an example array of 128 printed elements of a phased-array antenna system 175 that uses printed active components. The phased-array antenna can include an array of control elements 180 interlaced within arrays of micro-assembled radio-frequency components. The control elements can be used to send a signal to the antennas. The control elements can also be used to send a control signal to the phase-control devices 106 to control or adjust the phase of a signal sent through the antennas 102 enabling electronic beam steering.

Figure 2:
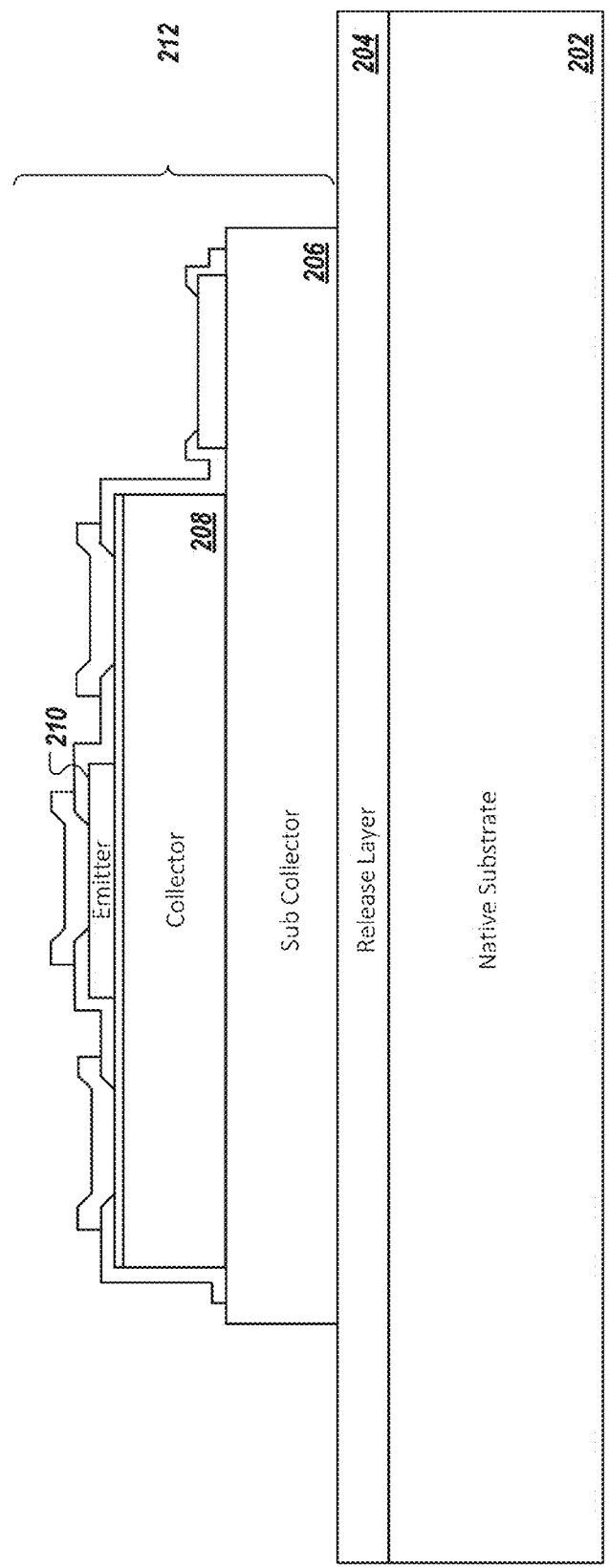
FIG. 2 is a cross section of a transfer-printable heterojunction bipolar transistor.

FIGS. 2 through 5 illustrate releasable radio-frequency transistors that are suitable for micro assembly, formed on compound semiconductor materials, such as those grown on a GaAs or InP substrate. In some embodiments, as illustrated in FIG. 2, transistors are formed on a release layer 204 with selective etching characteristics that allow the release layer 204 to be removed chemically, at least partially separating the releasable device 212 from its growth or native substrate 202. The releasable device 212 can include an emitter 210 formed on a collector 208 that is itself, in certain embodiments, formed on a sub-collector 206 formed over the release layer 204. The collector 208 can include layers of doped semiconductor material as can the sub-collector. The sub-collector can be doped to increase the conductivity of the semiconductor. The transistor can be a radio-frequency transistor such as a heterojunction bipolar transistor or high electron-mobility transistor.

Figure 3:
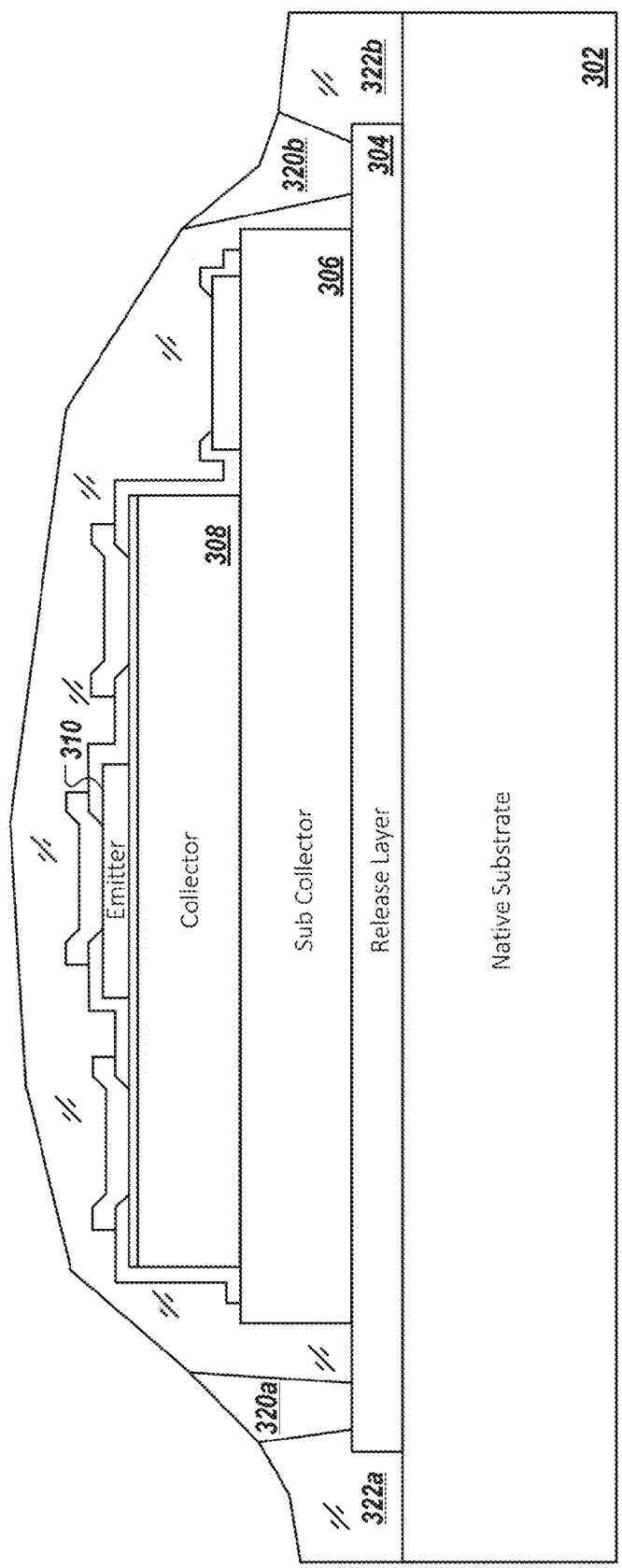
FIG. 3 is a cross section of a transfer-printable heterojunction bipolar transistor with anchors, tethers and encapsulation.

FIG. 3 is an illustration of a transfer-printable heterojunction bipolar transistors with anchors, tethers and encapsulation. In the process of preparing releasable objects such as a radio-frequency transistor for micro assembly, structures that maintain the spatial configuration of the object through the release process can be used. Structures that maintain the spatial configuration, often referred to as anchors, tethers, or other stabilization structures, can include photoresist materials, epoxies, polyimides, dielectrics, metals, and/or semiconductors. Such structures maintain contact to the native substrate 302 or other fixed body throughout the release process. FIG. 3 is an example illustration that shows the formation of such structures, e.g. made from photoresist that also encapsulate the active components of the device from the chemistries used in the release process, thereby providing additional benefit. Photodefinable materials are advantageous for this kind of anchoring, tethering, or encapsulation structures, offering ease of formation, and in many cases ease of removal by dissolution in wet chemicals, organic solvents or aqueous mixtures, or by ashing in oxygen and/or fluorine compounds. In the example shown in FIG. 3, two tethers 320a and 320b (collectively 320) secure the device to substrate 302. Each tether 320a and 320b is connected to an anchor, such as anchors 322a and 322b (collectively 322), respectively. The chemical selectivity of the tethers 320 and anchors 322 is such that it is not impacted (e.g., or minimally impacted) when the release layer 304 is removed (e.g., with an etch).

Figure 4:
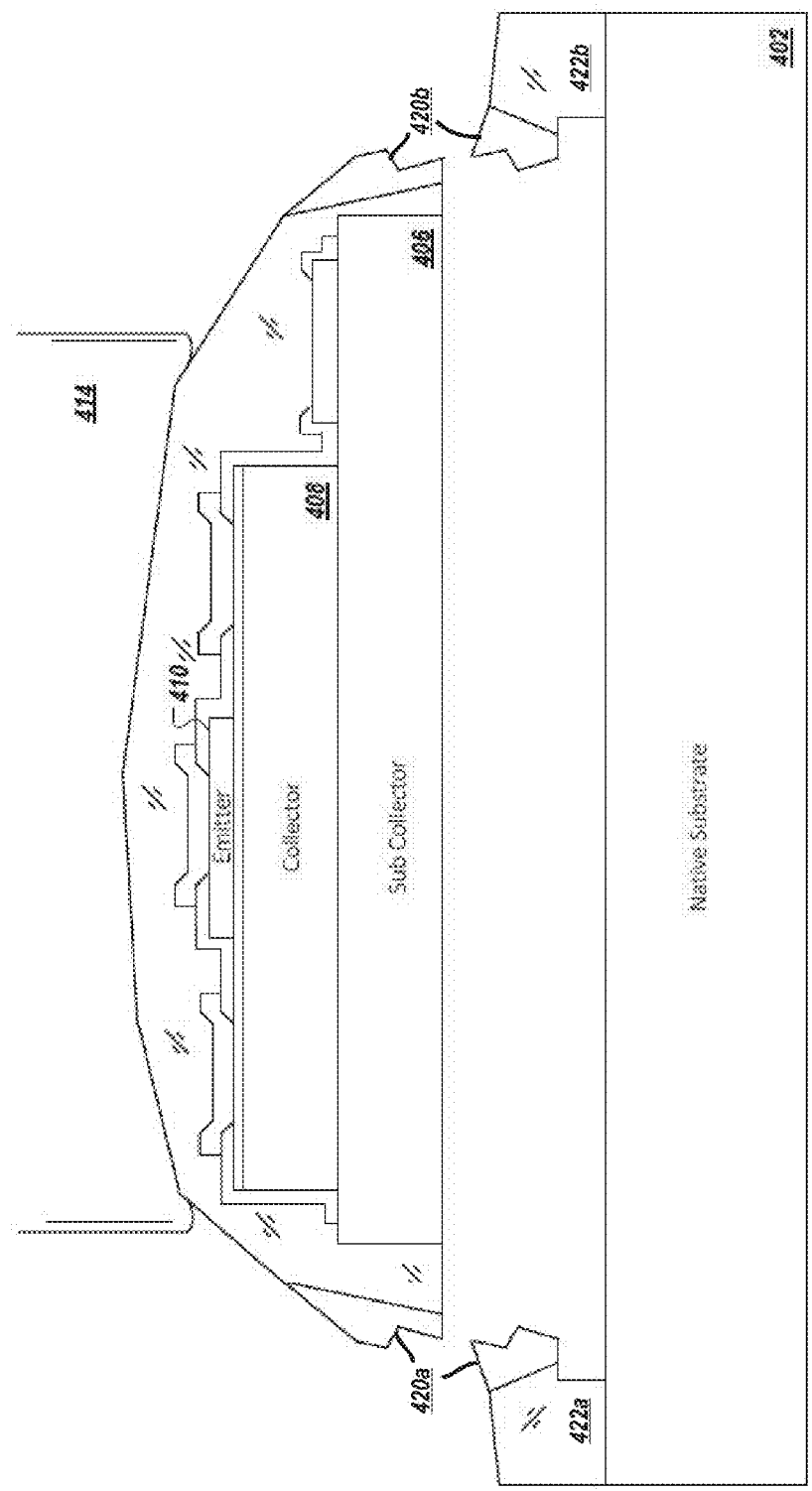
FIG. 4 is a cross section of release and removal of a transfer-printable heterojunction bipolar transistor.

FIG. 4 is an illustration of release and removal of a transfer-printable heterojunction bipolar transistor from a native substrate 402. After formation of anchoring, tethering, or encapsulation structures, the release layer (304 in FIG. 3) can be removed chemically. Chemical reactants etch the release layer, gaining access through points of ingress (not shown) formed in the anchoring, tethering, and or encapsulation structures. Etch reaction products exit the space under the releasable object through points of egress (not shown) that are in many but not all cases the same as the points of ingress. When the release layer is fully or partially removed, the releasable object is said to be at least partially released and ready for retrieval by a transfer element 414. The spatial configuration is maintained by the tethers (e.g., 320 in FIG. 3) and the anchors (e.g., 322 in FIG. 3). The transfer element 414 contacts and adheres to the at least partially released object. It is advantageous for the transfer element 414 to be conformable to make intimate contact with at least a portion of the topography of the releasable object. For example, the transfer element 414 can include a conformable material, such as PDMS. After adhering to the at least partially released object, the transfer element 414 moves away from the native substrate 402, maintaining adhesion to the released object, thereby retrieving, removing, separating, or picking the object from its native substrate 402. In the process of removal, the anchor or tether structures fracture or lose connection to the native substrate 402 or the released object. Selection of materials with specific fracture properties, adhesion properties, or definition of geometries with stress-concentration features in the anchoring and tethering structures are beneficial for controlling the points of separation or fracture. In the example shown in FIG. 4, two tethers 420a and 420b (collectively 420) secure the device to substrate 402. Each tether 420a and 420b is connected to an anchor, such as anchors 422a and 422b (collectively 422), respectively. As shown in FIG. 4, when a transfer element 414 picks up the device, the tethers 420 are fractured.

Figure 5:
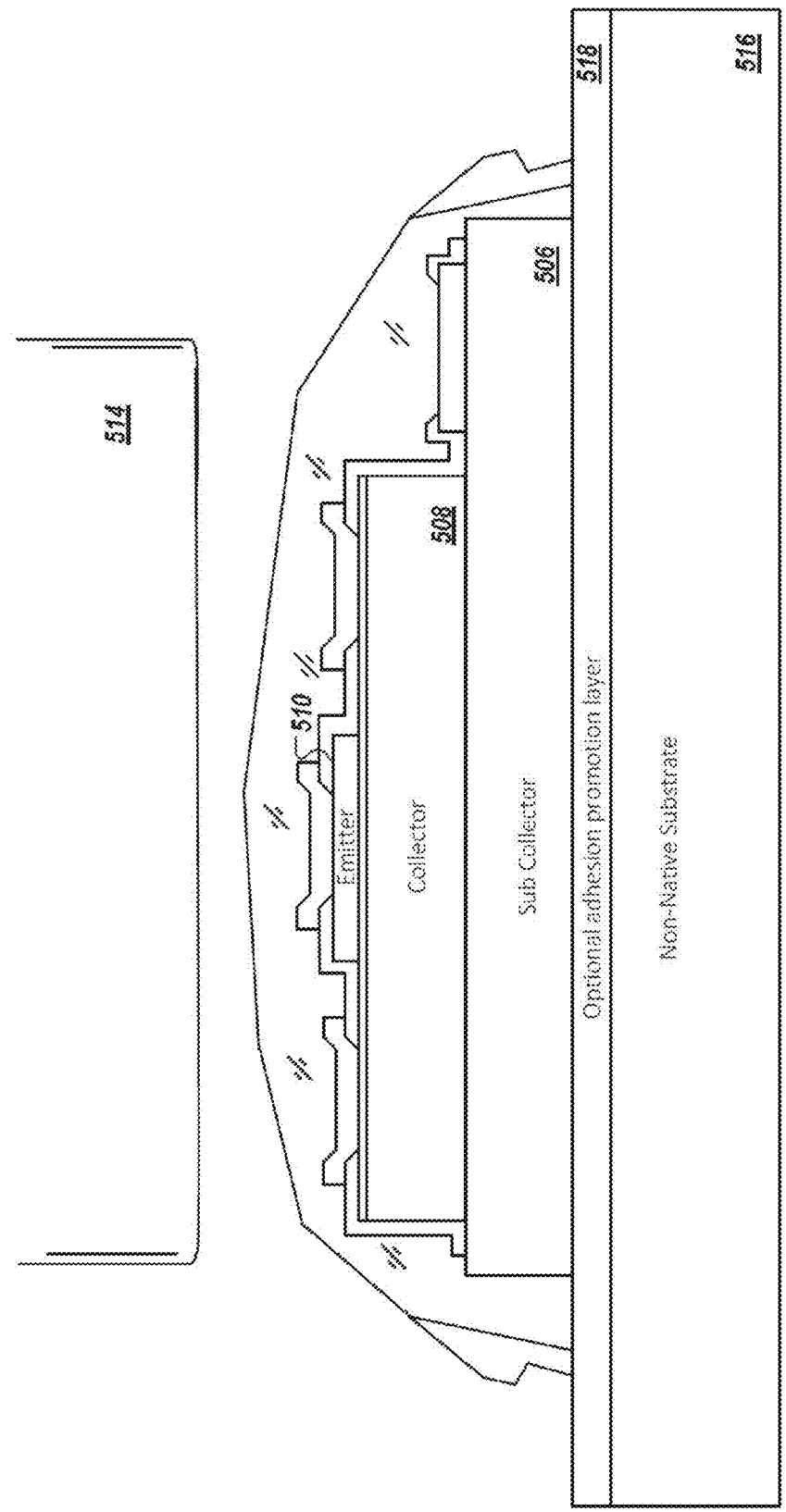
FIG. 5 is a cross section of placement and printing of a transfer printable heterojunction bipolar transistor.

FIG. 5 is an illustration of placement and printing of a transfer printable heterojunction bipolar transistor. The transfer element 514 (corresponding to element 414 of FIG. 4) places the radio-frequency device on a non-native substrate 516 by contacting the device to the non-native substrate 516 and removing the transfer element 514. Kinetically switchable adhesion to the transfer element 514, compression against the non-native substrate 516, contact between flat surfaces of the device and the non-native substrate 516, addition of flat or conformable adhesion-promoting layers 518, exposure to electromagnetic radiation, mechanical shear, heat, plasma-activation, metallic bonds, or softening, flow, or ablation of a material at the interface between the released object and the transfer element 514 facilitate the separation of the released device from the transfer element 514 and transfer to the non-native substrate 516. Adhesion-promoting layers 518 might include planarization layers, for example BCB, polyimide, polybenzoxazole, flux, conformable dielectric or conductive materials, or spin-on glass materials. Adhesion-promoting layers 518 can also have mechanical properties that facilitate intimate contact to a surface of the released object, for example, silicones, expoxies, polyimides, polybenzoxazole, soft or liquid metals, flux, or BCB. Adhesion-promoting layers 518 might also be photo-active, for example, cross-linkable by exposure to light. In those embodiments, it is advantageous to expose some or all of the adhesion-promoting layers 518 to light during or after the transfer process to maintain the spatial location and orientation of the transferred device.

Figure 6:
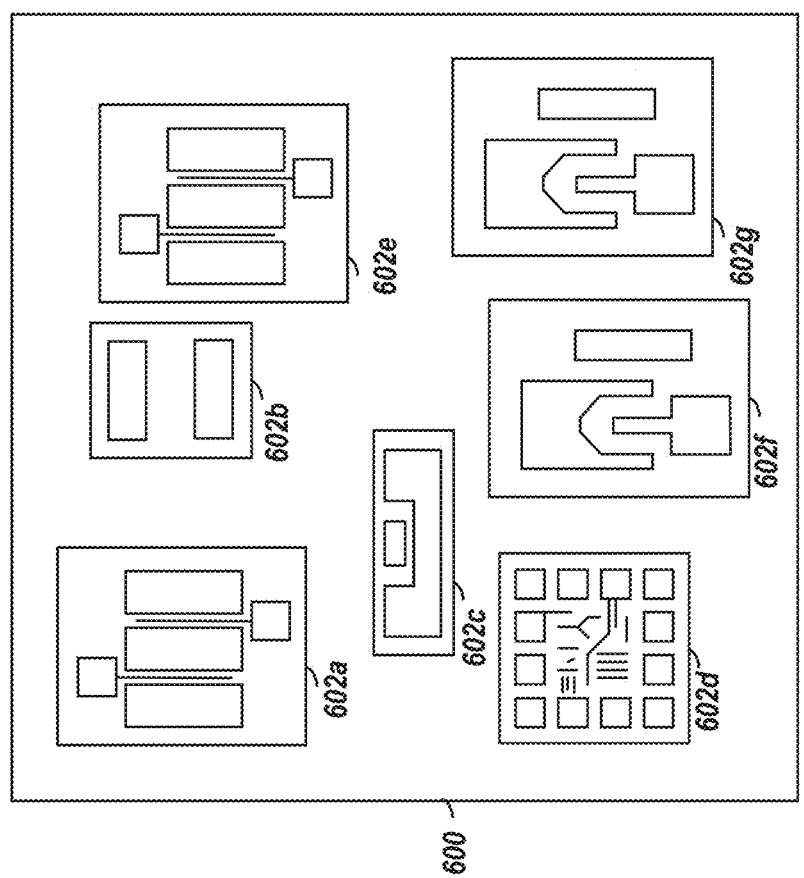
FIG. 6 is a schematic of transfer-printed heterogeneously integrated monolithic microwave integrated circuits.

FIG. 6 is an illustration of transfer-printed heterogeneously integrated monolithic integrated circuits 602a-602g, such as microwave integrated circuits. Micro assembly of a diverse set of devices from multiple source wafers can produce high-frequency integrated circuits on a different substrate, non-native substrate 600 that supports the diverse set of integrated circuits 602a-602g. The non-native substrate 600 is non-native to some or all of the components of the integrated circuits 602a-602g. For example, the non-native substrate 600 can be aluminum oxide ceramic, aluminum nitride ceramic, silicon nitride ceramic, sapphire, glass, diamond, diamond-like carbon, silicon, beryllium oxide, glass-resin composite, polymer, plastic, polymer, metal, or copper. The non-native substrate 600 can be selected for thermal properties, cost, radio-frequency response characteristics, size, mechanical properties, or other desirable attributes. In some embodiments, the non-native substrate 600 is flexible. As an example, the integrated circuits 602a-602g might include a heterojunction bipolar transistor at least partially formed on gallium arsenide or indium phosphide substrates and transferred to the non-native substrate 600, high electron-mobility transistors based on GaAs, InP, or GaN related materials at least partially formed on their native substrates (e.g., 402 in FIG. 4) and transferred to the non-native destination substrate, SiGe transistors at least partially formed on silicon-on-insulator substrates and transferred to their non-native destination substrates, or diodes, passive components, and signal processing integrated circuits at least partially formed on their native substrates, for example silicon or silicon-on-insulator wafers, and transferred to the non-native destination substrate.

This configuration of a diverse set of devices 602a-602g on a single non-native substrate 600 offers materials reduction cost and performance advantages because many of these kinds of integrated circuits require only a small fraction of their area to be populated with active components. The process of forming the active components can be costly on a per-area basis, and the micro-assembled set described herein can facilitate the formation of the active components in an area-dense configuration on their native source substrates, with each area-dense configuration supplying components for a much larger area device on a non-native destination substrate. Micro assembly provides benefit because many of the components of these integrated circuits are miniaturize-able to sizes that are difficult to assemble by conventional assembly techniques, for example, less than 0.1 mm in one lateral dimension, or less than 0.05 mm or 0.02 mm in at least one lateral dimension. The micro-assembled devices can be interconnected using thin-film interconnections, thereby providing interconnections with reduced parasitic effects.

Figure 7:
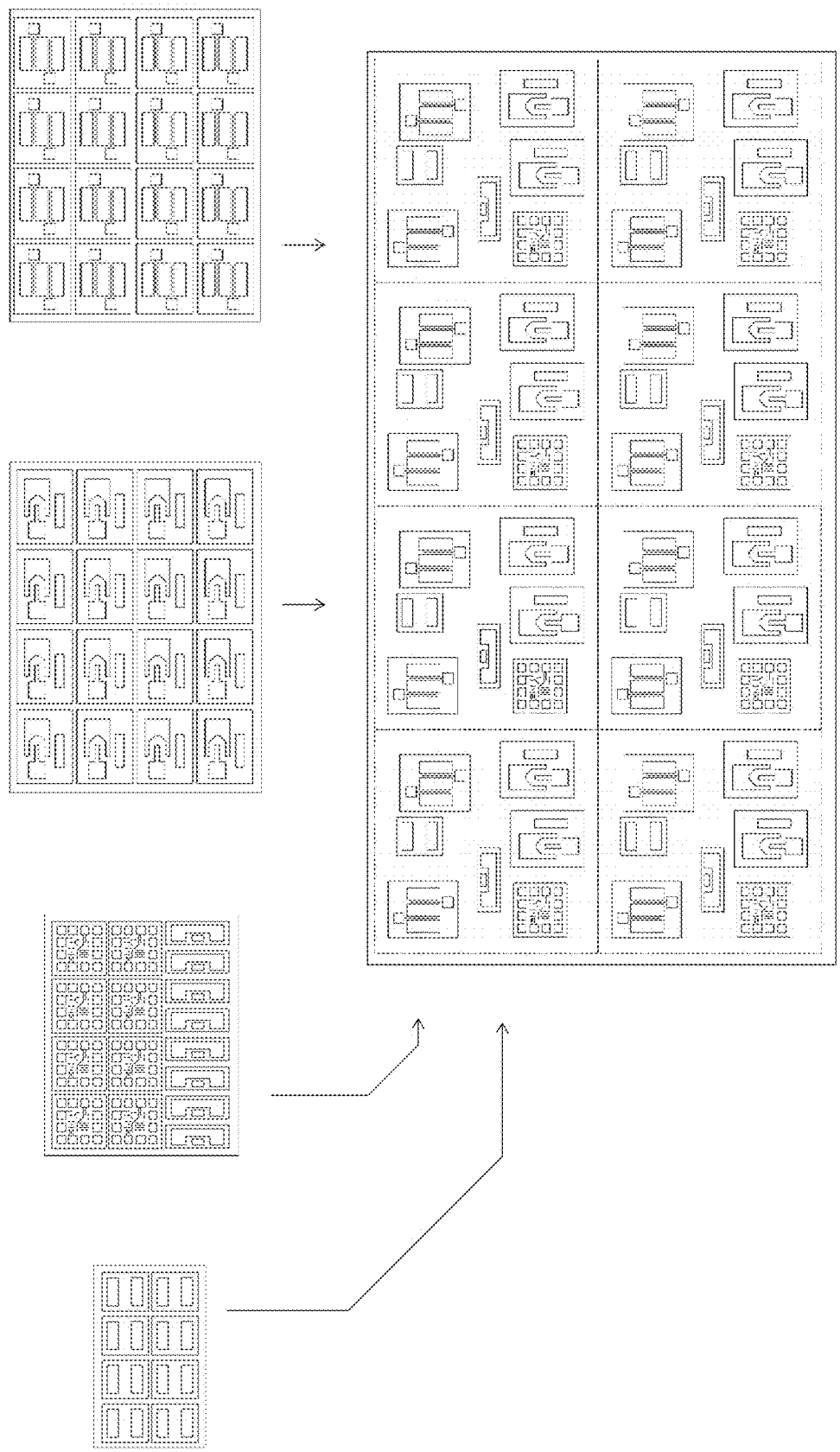
FIG. 7 is a schematic of transfer-printed heterogeneously integrated monolithic microwave integrated circuits including native source substrates and a destination substrate.

FIG. 7 is an illustration of transfer-printed heterogeneously integrated monolithic microwave integrated circuits. FIG. 7 illustrates a diverse set of components formed in an area-dense configuration on multiple native substrates suitable for micro assembling multiple integrated circuits on non-native destination substrates.

Radars and other electronic systems often utilize capacitors to supply and store energy. For example, capacitors, (e.g., capacitors with high power density) are used to meet the high current-pulse requirements of pulse radar and laser applications and are also useful for phased-array antenna systems. The disclosed technology can provide capacitors and capacitor stacks that can be incorporated into micro-scale systems, such as radar systems and other electronic systems, using micro-assembly technology.

Figure 8:
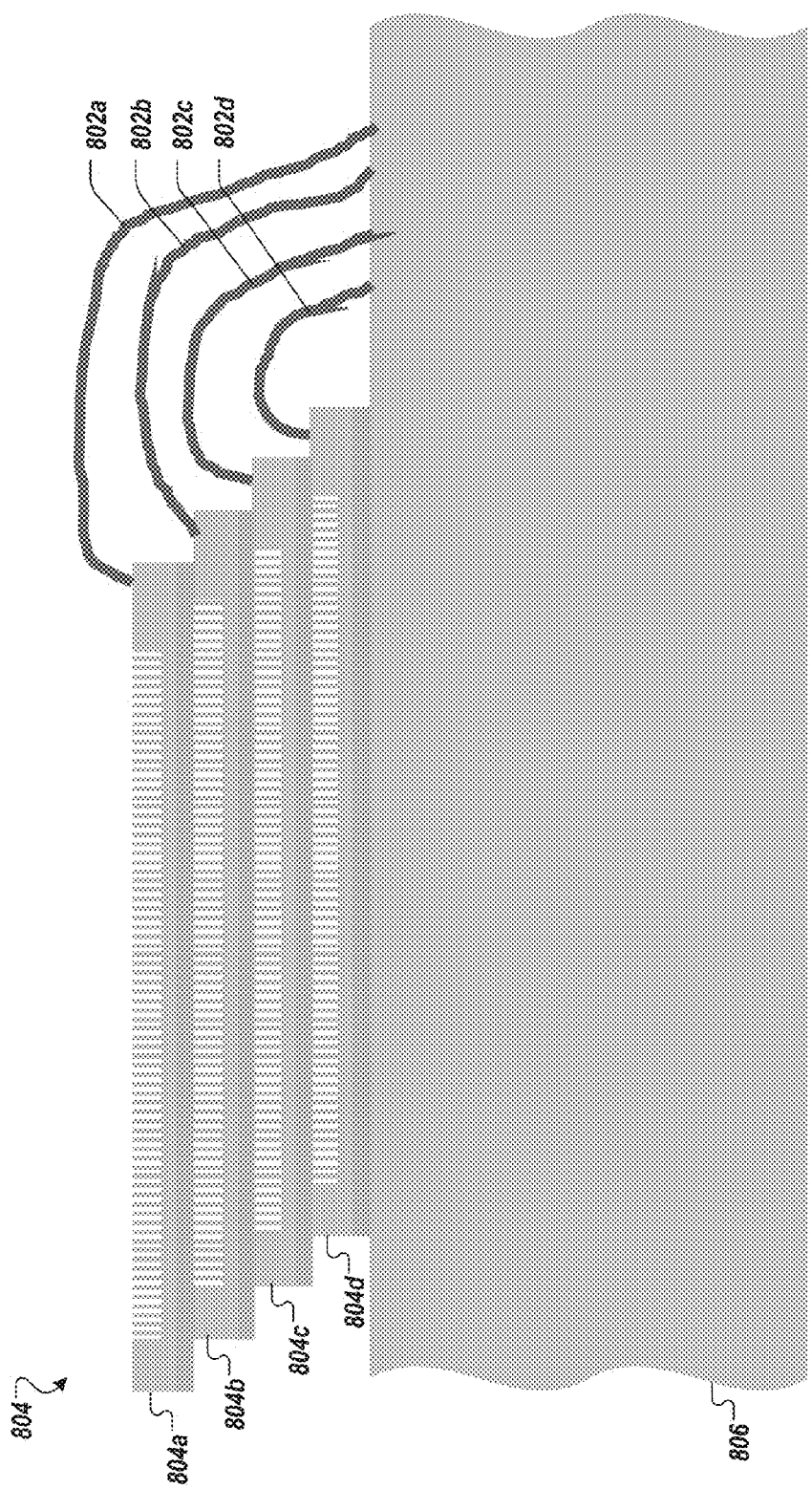
FIG. 8 is a cross section of a capacitor stack, according to an embodiment of the present disclosure.

FIG. 8 is a drawing of a capacitor stack 804 on a substrate 806, according to an embodiment of the present disclosure. Assembling thin capacitors in an offset stack leaves surface area exposed such that the capacitors can be connected to a circuit. Capacitor stack 804 includes the capacitors 804a, 804b, 804c, 804d. Each of the capacitors 804a-804d is a thin metal-insulator-metal structure. Each of capacitors 804a-804d are micro transfer printed to their respective destinations. In the example shown in FIG. 8, capacitor 804c is stacked atop capacitor 804d at an offset, which leaves an area exposed on the surface of capacitor 804d. The exposed surface area of 804d includes an electrical contact that is joined with interconnection 802d. The remaining capacitors 804a and 804b are similarly stacked with an offset, enabling interconnections 802a, 802b, and 802c to be joined with the electrical contacts on the exposed surface areas of the capacitors 804a, 804b, and 804c, respectively. Each of capacitors 804 is connected to the silicon substrate 806 using interconnections 802a, 802b, 802c, and 802d (collectively, interconnections 802) in order to assemble a circuit. The capacitors can be interconnected in a parallel or series circuit. Thus, capacitors with a variety of capacitances can be provided using the appropriate number of capacitors in a stack, the appropriate physical size of each capacitor in a stack, and the appropriate wiring scheme. For example, when each of capacitors 804 has a capacitance of 250 $nF/mm^2$ and the capacitor 804a are interconnected in a parallel circuit, the capacitance of the complete stacked capacitor is 1 $\mu F/mm^2$.

Figure 9:
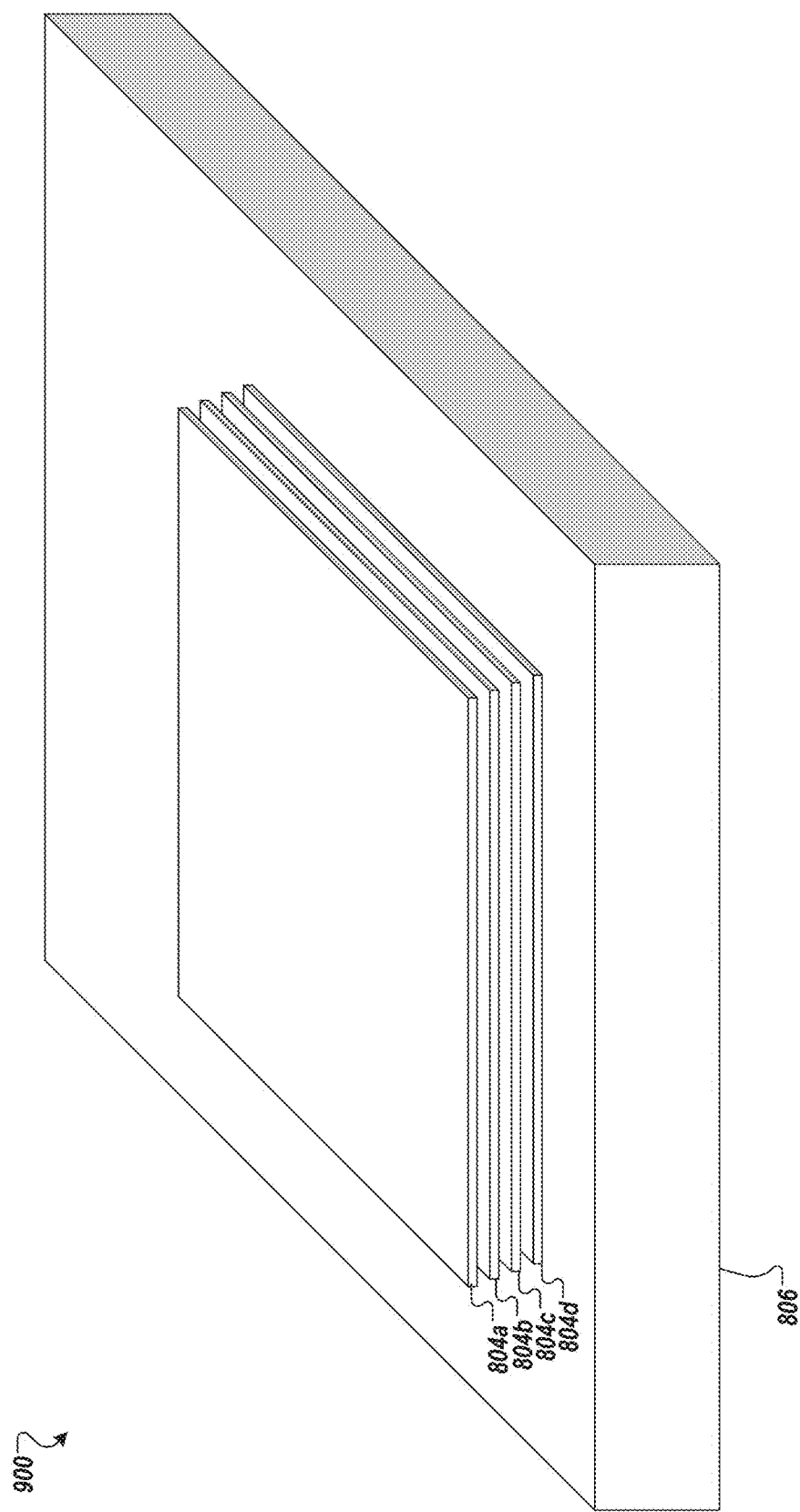
FIG. 9 is a perspective of a capacitor stack with two-dimensional offset, according to an embodiment of the present disclosure.

In certain embodiments, the offset can be along one dimension as shown in FIG. 8. For example, when the thin capacitors are stacked atop each other so that the width and length of each capacitor are parallel, the capacitors are offset along the length of the capacitor only, or offset along the width of the capacitor only. In some embodiments, the offset can be along two dimensions, for example along both the width dimension and the length dimension, for example as shown in FIG. 9. FIG. 9 is an illustration of a capacitor stack with offset printing, according to an embodiment of the present disclosure. The capacitor stack 900 show the capacitors 804 stacked using micro transfer printing in an offset arrangement. The capacitors 804 are stacked vertically and offset along the two remaining axes. For example, when the thin capacitors are stacked atop each other so that the width and length of each capacitor are parallel, the capacitors are offset along the length of the capacitor and offset along the width of the capacitor. In either of the embodiments of FIG. 8 or FIG. 9, the offset exposes a portion of the top surface of each capacitor (e.g., not covered by a capacitor stacked thereon) and the exposed portions can be used for contact terminals and wiring.

In some embodiments, each capacitor of the plurality of capacitors has a capacitance per unit area from 100 $nF/mm^2$ and 400 $nF/mm^2$. In other embodiments, each capacitor of the plurality of capacitors has a thickness of from 1 µm to 10 µm, 10 µm to 30 µm, 30 µm to 50 µm, or 50 µm to 100 µm. In further embodiments, each capacitor of the plurality of capacitors has a width of from 10 µm to 50 µm, 50 µm to 100 µm, or 100 µm to 200 µm. In some embodiments, each capacitor of the plurality of capacitors has a length of from 10 µm to 50 µm, 50 µm to 100 µm, or 100 µm to 200 µm.

Figure 10:
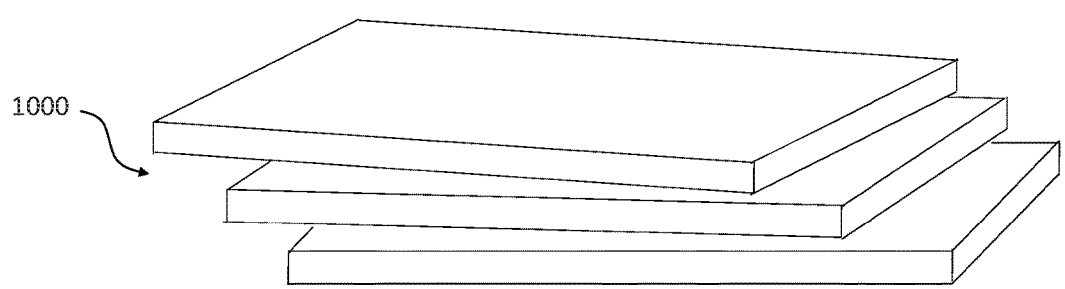
FIG. 10 is an optical micrograph of an example of offset-printed silicon membranes, according to an embodiment of the present disclosure.

FIG. 10 is an optical micrograph of an example of offset printing of silicon membranes, in this case an optical micrograph of a capacitor stack 1000 according to an embodiment of the present disclosure. In this embodiment, not only are the capacitors in each layer of the stack exposed in both the length and width dimensions, but the capacitors are each rotated by a different amount about a vertical axis perpendicular to the length and width directions of the capacitors.

Figure 11:
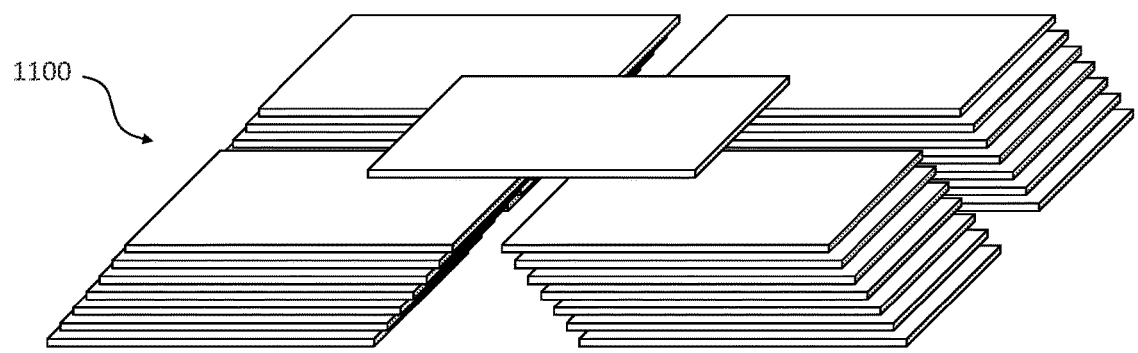
FIG. 11 is an optical micrograph of an alternative example of off-set printed silicon membranes, according to an embodiment of the present disclosure.

FIG. 11 is an optical micrograph of an alternative example of offset printing of silicon membranes. Membrane stack 1100 is another capacitor stack arrangement according to an embodiment of the present disclosure. These arrangements can be used to form capacitors with varying capacitance using micro transfer printed capacitor stacks.

Figure 14:
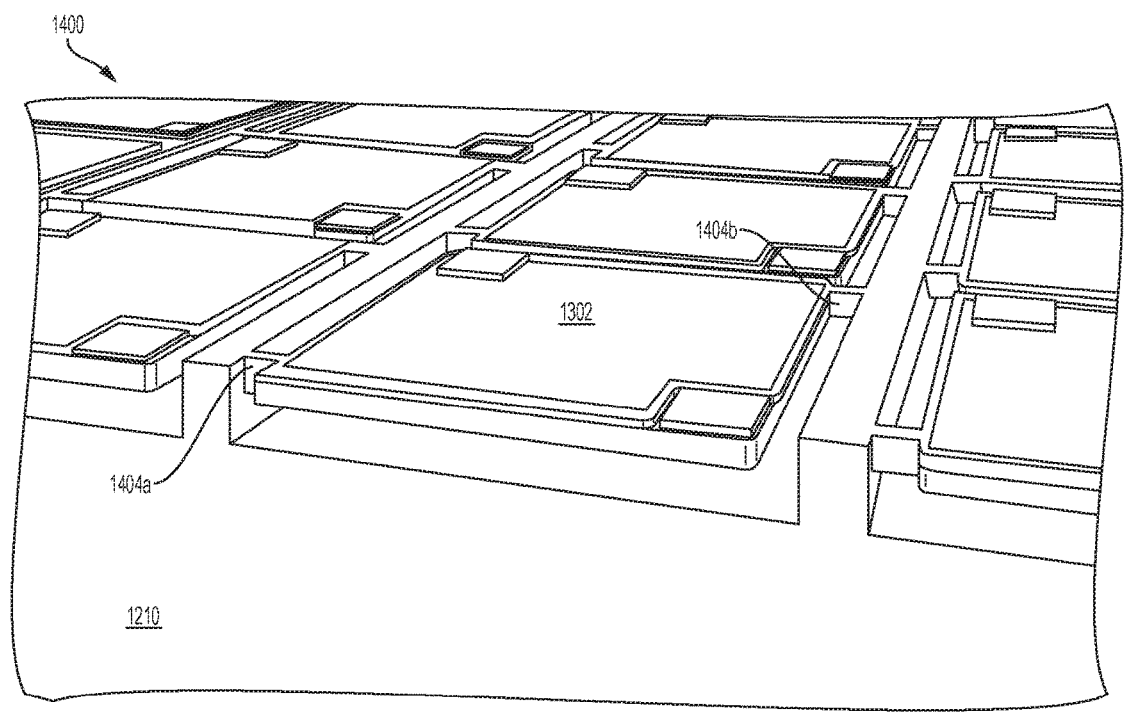
FIG. 14 is a perspective of an array of devices on a wafer, according to an embodiment of the present disclosure.

In an embodiment of the present invention, each printed capacitor includes a plurality of electrically connected capacitors. In one configuration, one or more of the capacitors of the plurality of electrically connected capacitors in a single printed capacitor are stacked-plate capacitors, as shown in FIG. 14. In another configuration, one or more of the capacitors of the plurality of electrically connected capacitors in a single printed capacitor are trench capacitors, as illustrated in FIG. 8. In an embodiment, two or more of the capacitors of the plurality of electrically connected capacitors in a single printed capacitor are electrically connected in parallel, as shown in FIG. 8. In an embodiment, two or more of the capacitors of the plurality of electrically connected capacitors in a single printed capacitor are electrically connected in series.

FIG. 8 illustrates an embodiment of the present invention having a plurality of vertical capacitors. Referring to FIG. 17, in a detail of FIG. 8, the vertical capacitors 1712 have first and second conductive layers 1704a, 1704b separated by a dielectric layer 1706. The first conductive layer 1704a of each vertical capacitor 1712 is electrically connected in common and the second conductive layer 1704b of each vertical capacitor 1712 is electrically connected in common to electrically connect the vertical capacitors 1712 in parallel. In the alternative embodiment of FIG. 18, the plurality of electrically connected capacitors are stacked horizontal or plate capacitors 1714. In yet another embodiment, two or more of the plurality of electrically connected capacitors are electrically connected in series. The printable capacitors are shown with optional solder balls (solder bumps) 1708 to facilitate interconnection after microtransfer printing. Stacked horizontal capacitors (FIG. 18) can be made by alternately patterning layers of electrical conductors 1704a, 1704b, such as polysilicon or aluminum, with insulators 1706, such as layers of oxide and nitride like silicon dioxide and silicon nitride.

Vertical capacitors 1712 can be made by first etching holes (e.g., cylindrical holes) into the substrate 806 or dielectric layers and then alternately depositing and patterning conductors and insulators, for example as described in U.S. Pat. No. 6,326,261. In one embodiment, the substrate 806 is a silicon substrate and the first conductor 1704a adjacent to the substrate is a heavily doped layer of the silicon substrate 806, such as an n+ layer, to form a conductor. A dielectric layer 1706 is grown or deposited (e.g., oxide and nitride layers) and the holes filled with a conductor, for example doped polysilicon or a metal to form the second conductors 1704*b*. The vertical capacitors 1712 can have a greater capacitance per unit area over the substrate 806, increasing the capacitance of the printable or printed capacitor.

Figure 19:
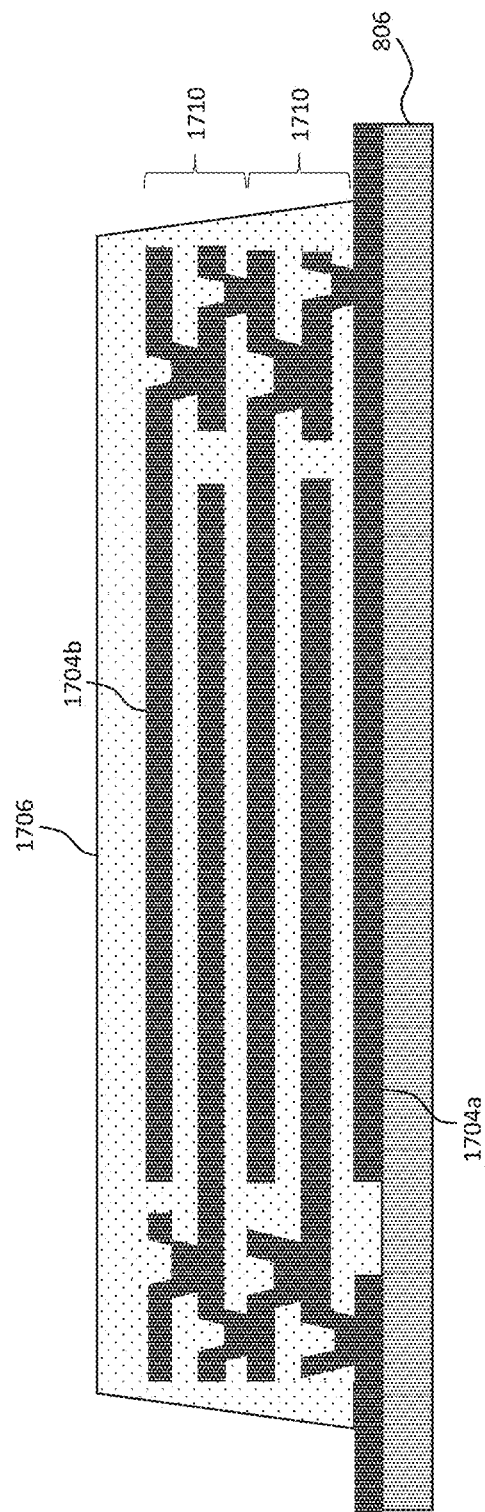
FIG. 19 is a cross-section of a printed capacitor having a plurality of multiple horizontal capacitors in each of a plurality of capacitor layers according to an embodiment of the present disclosure.
Figure 20:
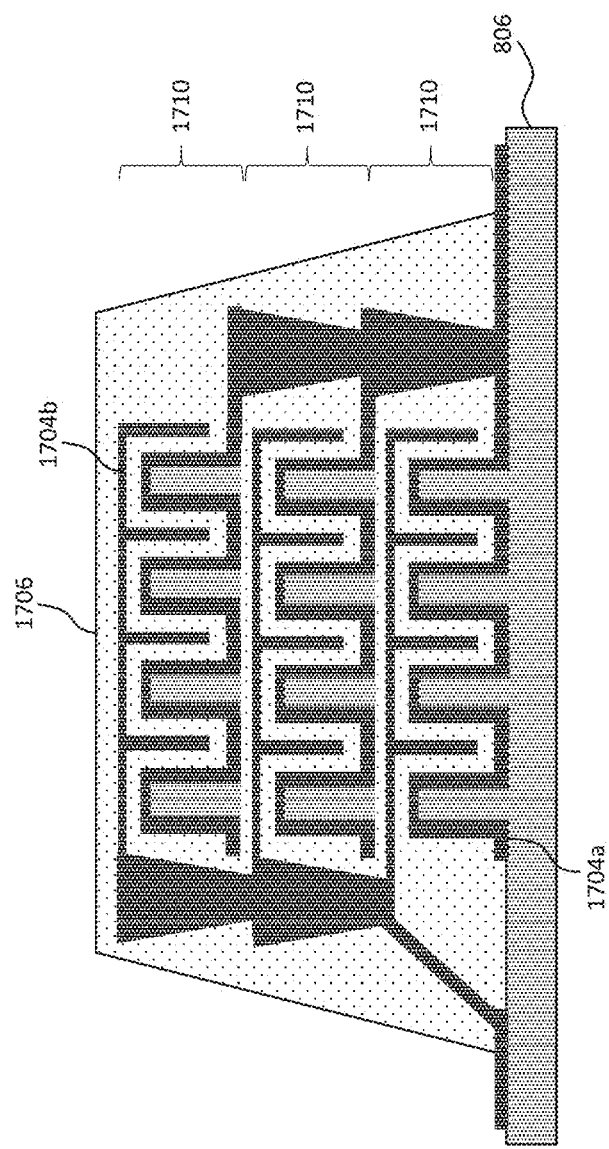
FIG. 20 is a cross-section of a printed capacitor having a plurality of multiple vertical capacitors in each of a plurality of capacitor layers according to an embodiment of the present disclosure.

Referring to FIGS. 19 and 20, each printable capacitor itself can have multiple capacitor layers 1710 to increase the capacitance of the printable capacitor. As shown in FIG. 19, capacitor layers of horizontal capacitors 1714 are electrically connected to form a capacitor with greater capacitance. As shown in FIG. 20, capacitor layers of vertical capacitors 1712 are electrically connected to form a capacitor with greater capacitance. Each capacitor layer 1710 can be formed using the same methods with alternating patterns of metal connections for each terminal of each capacitor layer.

FIGS. 17-20 have a greatly exaggerated vertical scale to clarify the structure of the printed capacitors.

Figure 12:
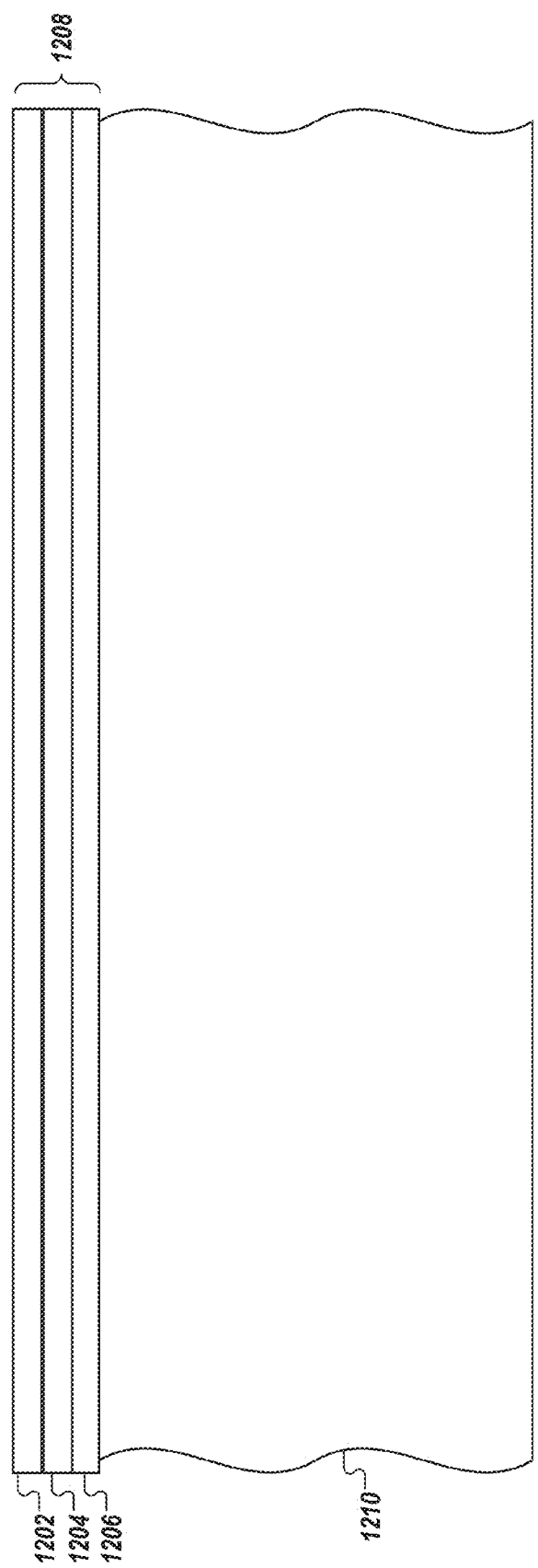
FIG. 12 is a cross section of a wafer, according to an embodiment of the present disclosure.
Figure 13:
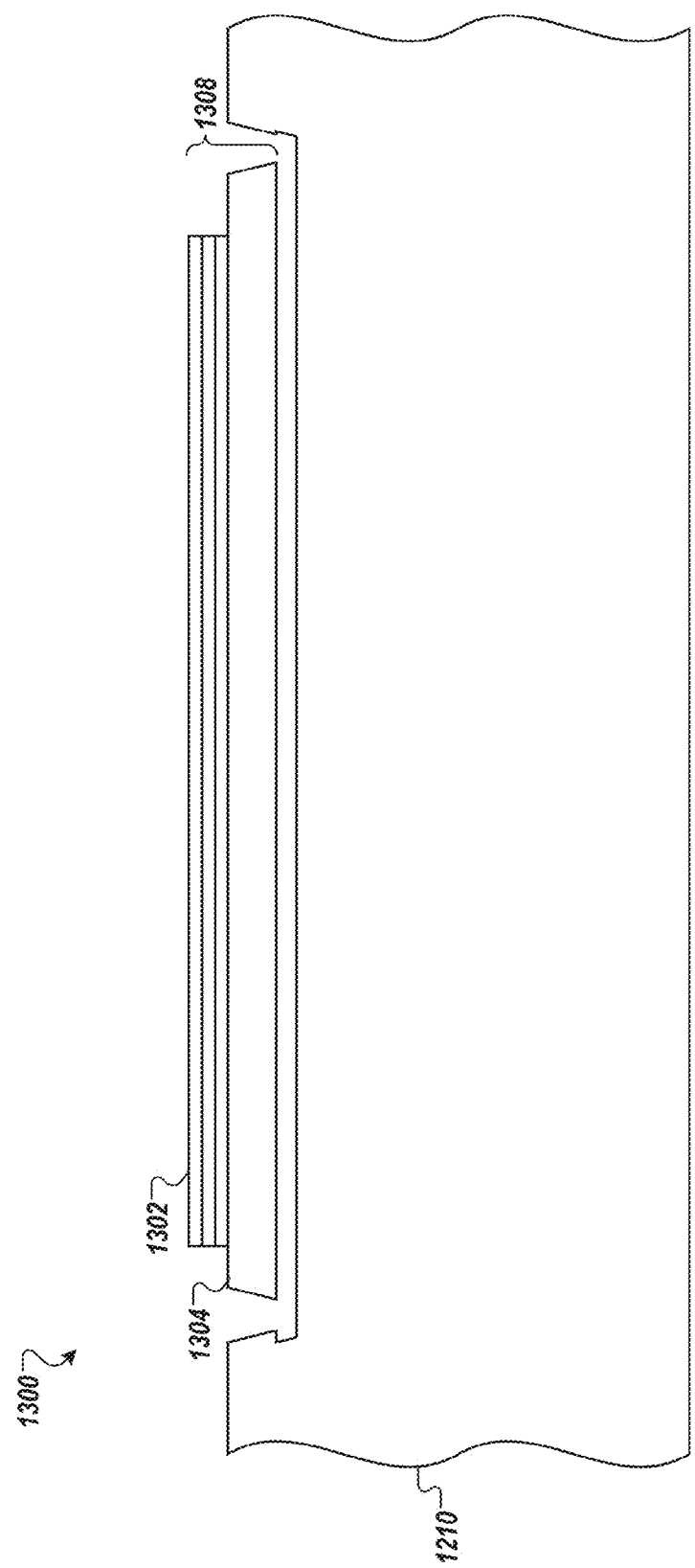
FIG. 13 is a cross section of a patterned and etched wafer of devices that has been undercut, according to an embodiment of the present disclosure.

FIGS. 12 and 13 illustrate the process of forming capacitors using a source substrate 1210. The process starts with a substrate 1210, such as a silicon (111) substrate. A bottom electrode 1206 is deposited and patterned onto the silicon wafer substrate 1210. In some embodiments, the substrate is gallium arsenide, gallium nitride, silicon, germanium, or a dielectric material. After the bottom electrode 1206 is deposited and patterned, a dielectric 1204 (e.g., polyethylene, BCB, Polycarbonate, Mylar, $SiO_2$, Polyimide, Epoxies, FR4, SiO, $Si_3N_4$, AlN, $Al_2O_3$, $Si_3N_4$, $BaTiO_3$, $NbO_x$, $Ta_2O_5$, SiC, HfO, $WO_2$, $Ta_2O_5$, $TiO_2$, $BaTiO_3$, $BaSrTiO_3$, $PbZrxTi_{1-x}O_3$, $Ba_{0.8}Pb_{0.2}(Zr_{0.12}Ti_{0.88})O_3$) is deposited, annealed, and patterned. After the dielectric 1204 has been deposited, annealed, and patterned, a top electrode 1202 is deposited and patterned to form a capacitor structure 1208. In some embodiments, the capacitor structure 1208 is a capacitor that has not been partially released (e.g., by etching a sacrificial layer). In other embodiments, the capacitor structure 1208 is delineated into a plurality of capacitors using, for example, a pattern-and-etch process.

After the appropriate materials to form the capacitor 1208 have been deposited and prepared as shown in FIG. 12, in some embodiments, a plurality of capacitors are delineated on the substrate 1210. This delineation can be accomplished using a pattern and etching the material. In some embodiments, the materials are deposited such that the delineation step is not necessary. As shown in FIG. 13, the substrate 1210 is etched to undercut a capacitor structure 1308 (e.g., by etching, such as a KOH etching) to at least partially separate a thin silicon membrane 1304 from the substrate 1210, leaving the thin-film capacitor 1302 attached only to the thin silicon membrane 1304. The printable capacitor structure 1308 includes the thin-film capacitor 1302 attached to the thin silicon membrane 1304 and remains partially attached to the substrate 1210 by a tether (not shown) to hold the unit in place. The tether is subsequently broken during the micro transfer printing process such that the capacitor structure 1308 can be transferred to a destination substrate. Each of the printable capacitors in the wafer of printable capacitors can include a plurality of electrically connected vertical capacitors or a plurality of electrically connected horizontal capacitors, a plurality of capacitor layers 1610, or a combination thereof, as illustrated in FIGS. 17 and 18.

FIG. 14 is an illustration of an array of printable capacitors 1302 secured to a substrate 1210 by tethers 1404*a* (see e.g., capacitor 1302 is secured by tethers 1404*a* and 1404*b* (collectively tethers 1404). Individual capacitors can be transferred by the transfer device (e.g., an elastomer stamp) to a destination substrate. In certain embodiments, the destination substrate (e.g., substrate 1210) is non-native to the capacitors. In certain embodiments, the capacitors are stacked to create an offset stacked capacitor as shown in FIGS. 8 and 9 above. The microtransfer printing device attaches to the microtransfer printable capacitor 1402, thus breaking the tether 1404*a* and leaving an empty space in the array of capacitors on the silicon substrate 1210. In subsequent microtransfer printing steps, the microtransfer printing device is configured to remove a second capacitor from a different location of the array. Each of the plurality of printable capacitors comprises a top surface coated with a bonding layer that facilitates bonding of the printable capacitor to a contact surface of a microtransfer printing device (e.g., conformable transfer device, elastomer stamp). In certain embodiments, the density of capacitors is 5 to 15 capacitors per square millimeter.

The array 1400 is used by the microtransfer printing process to transfer the capacitors to a receiving surface of a substrate (e.g., glass, plastic, or sapphire). The microtransfer printing device contacts the first capacitor with a transfer device (e.g., a conformable transfer device) having a contact surface, thereby temporarily binding the capacitor to the contact surface such that the contact surface has the capacitor temporarily disposed thereon. The transfer device travels to the non-native destination substrate, and by separating the contact surface of the conformable transfer device and the capacitor, assembles the capacitor on the receiving surface of the non-native destination substrate. In some embodiments, the receiving surface comprises an adhesive layer that is contacted by the capacitor. In certain embodiments, the contacting is performed at a temperature of less than 400° C. Next, the transfer device contacts a second capacitor of the array 1400, binds the capacitor, then travels to the non-native destination substrate and separates the contact surface of the transfer device and the capacitor, assembling the second capacitor atop the surface of the first capacitor at an offset. The two capacitors are then electrically connected by thin-film wafer-level interconnections, in either parallel or series. In certain embodiments, a plurality of capacitors are stacked. In some embodiments, the capacitor comprises a top surface coated with a release layer that facilitates bonding of the capacitor to the contact surface of the conformable transfer device (such as a photoresist). The capacitors are assembled with placement accuracy greater than or equal to 25 microns.

Figure 15:
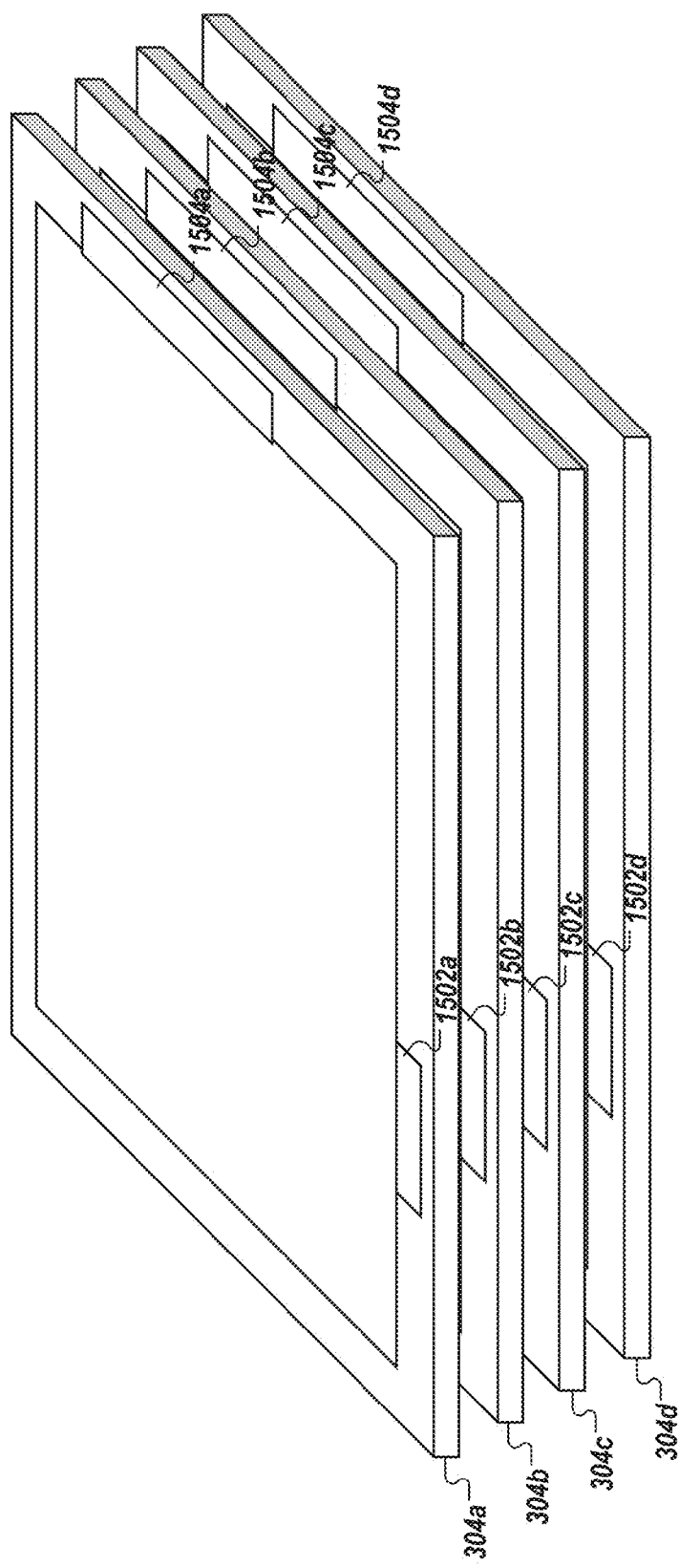
FIG. 15 is a perspective of a capacitor stack with exposed electrical contacts, according to an embodiment of the present disclosure.

FIG. 15 is a drawing of a capacitor stack with exposed electric contacts, according to an embodiment of the present disclosure. The individual offset stacked capacitors 804*a*, 804*b*, 804*c*, and 804*d* include first electrical contacts 1502*a*, 1502*b*, 1502*c*, and 1502*d*, respectively. The individual offset stacked capacitors 804*a*, 804*b*, 804*c*, and 804*d* also include second electrical contacts 1504*a*, 1504*b*, 1504*c*, and 1504*d*, respectively. As the offset stack is assembled, the micro transfer printing process is configured to leave the electrical contacts exposed for the purpose of interconnecting the stacked capacitors 804.

Figure 16:
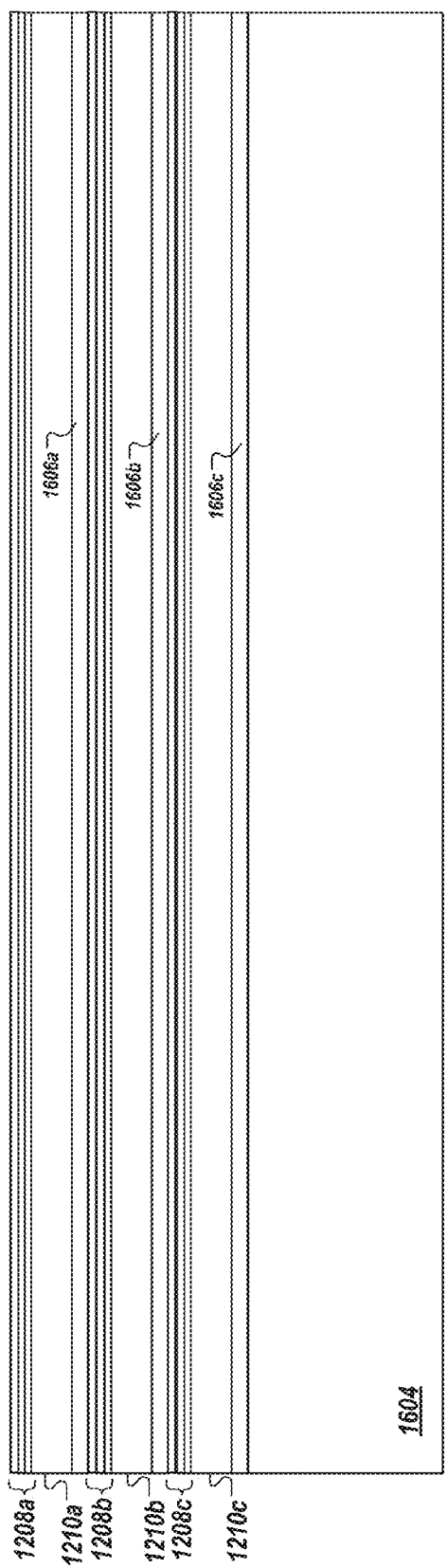
FIG. 16 is a cross-section of a plurality of stacked wafers, according to an embodiment of the present disclosure.

FIG. 16 is a cross-sectional view of a stacked wafer, according to an embodiment of the present disclosure. A stacked wafer is a wafer multi-layer stack of capacitors on a wafer. A plurality of capacitor structures 1208*a*-1208*c* (collectively 1208) are formed on one another. A first capacitor structure 1208*c* is formed on a first substrate 1210*c*, a second capacitor structure 1208*b* is formed on a second substrate 1210*b*, and a third capacitor structure 1208*a* is formed on a third substrate 1210*a*. In some embodiments, additional capacitor structures and substrates are formed thereon as desired. In some implementations, each capacitor structure is separated from the substrate above by a buffer layer, such as buffer layers 1606*a* 1606*b*, and 1606*c* (collectively 1606). In some implementations, the buffer layers 1606 are sacrificial layers. In some embodiments, as explained above, a capacitor structure is delineated to form several capacitors. Thereafter, the capacitors are micro assembled as desired. Once each capacitor is formed the top capacitor structure 1208*a* is removed, and then any remaining substrate 1210*a* material and the buffer layer 1606*a* are removed. The process of forming, printing, and removing substrates and buffer layers can continue for as many structures as are present.

Radar systems and other electronic devices also benefit from low-cost interposer technologies. The interposer serves as an intermediating layer between advanced chips and the underlying printed circuit board. In some embodiments, functionalities are integrated into the interposers. For example, power distribution can be integrated into the interposer such that power is efficiently and smartly distributed about the system. In another example, capacitors, resistors, inductors, and diodes can be integrated into the interposers. The interposer itself can be formed of many materials, such as glass, plastic, and sapphire. Materials such as glass are beneficial because of the cost and potential for panel-level processing. However, it is difficult to integrate active components into glass interposers, compared to silicon. The disclosed technology, in some embodiments, utilizes micro assembly techniques (e.g., micro transfer printing) with both glass and silicon interposers to generate "active" interposers. For example, micro transfer printing can be used to integrate small diodes or transistors onto the glass or silicon interposers. The micro-scale nature of the printed elements allows for the elements to be interconnected using the standard metallization processes (integration without any additional process steps).

Having described various embodiments of the disclosed technology, it will now become apparent to one of skill in the art that other embodiments incorporating the concepts can be used. It is felt, therefore, that these embodiments should not be limited to the disclosed embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions can be conducted simultaneously.

What is claimed:

1. A device comprising:
   a destination substrate;
   a multilayer structure on the destination substrate, wherein the multilayer structure comprises a plurality of printed capacitors stacked on top of each other with an offset between each capacitor along at least one edge of the capacitors; and
   wherein each printed capacitor includes a plurality of electrically connected capacitors.

2. The device of claim 1, wherein one or more of the capacitors of the plurality of electrically connected capacitors are stacked-plate capacitors.

3. The device of claim 1, wherein one or more of the capacitors of the plurality of electrically connected capacitors are trench capacitors.

4. The device of claim 1, wherein two or more of the capacitors of the plurality of electrically connected capacitors are electrically connected in parallel.

5. The device of claim 1, wherein two or more of the capacitors of the plurality of electrically connected capacitors are electrically connected in series.

6. The device of claim 1, wherein each printed capacitor includes a plurality of capacitor layers, each capacitor layer including a plurality of electrically connected capacitors.

7. A wafer of printable capacitors, the wafer comprising:
   a source substrate;
   a first sacrificial layer on a process side of the source substrate;
   a first set of printable capacitors on the first sacrificial layer;
   a second sacrificial layer on the first set of printable capacitors;
   a second set of printable capacitors on the second sacrificial layer; and
   wherein each printed capacitor includes a plurality of electrically connected capacitors.

8. The device of claim 7, wherein one or more of the capacitors of the plurality of electrically connected capacitors are stacked-plate capacitors.

9. The device of claim 7, wherein one or more of the capacitors of the plurality of electrically connected capacitors are trench capacitors.

10. The device of claim 7, wherein two or more of the capacitors of the plurality of electrically connected capacitors are electrically connected in parallel.

11. The device of claim 7, wherein two or more of the capacitors of the plurality of electrically connected capacitors are electrically connected in series.

12. The device of claim 7, wherein each printed capacitor includes a plurality of capacitor layers, each capacitor layer including a plurality of electrically connected capacitors.

13. A method for assembling a plurality of capacitors on a receiving surface of a substrate, the method comprising:
   contacting a first capacitor of the plurality of capacitors with a transfer device having a contact surface, thereby temporarily binding the capacitor to the contact surface such that the contact surface has the capacitor temporarily disposed thereon;
   contacting the first capacitor disposed on the contact surface of the transfer device with the receiving surface of the substrate;
   separating the contact surface of the transfer device and the capacitor, wherein the capacitor is transferred onto the receiving surface, thereby assembling the capacitor on the receiving surface of the substrate;
   contacting a second capacitor of the plurality of capacitors with the transfer device, thereby binding the second capacitor to the contact surface such that the contact surface has the second capacitor disposed thereon;
   contacting the second capacitor disposed on the contact surface of the transfer device with a surface of the first capacitor assembled on the receiving surface of the substrate; and
   separating the contact surface of the transfer device and the second capacitor, wherein the second capacitor is transferred onto the capacitor assembled on the receiving surface of the substrate, thereby assembling the second capacitor on the capacitor assembled on the receiving surface of the substrate; and wherein each first and second printed capacitor includes a plurality of electrically connected capacitors.

14. The device of claim 13, wherein one or more of the capacitors of the plurality of electrically connected capacitors are stacked-plate capacitors.

15. The device of claim 13, wherein one or more of the capacitors of the plurality of electrically connected capacitors are trench capacitors.

16. The device of claim 13, wherein two or more of the capacitors of the plurality of electrically connected capacitors are electrically connected in parallel.

17. The device of claim 13, wherein two or more of the capacitors of the plurality of electrically connected capacitors are electrically connected in series.

18. The device of claim 13, wherein each printed capacitor includes a plurality of capacitor layers, each capacitor layer including a plurality of electrically connected capacitors.

* * * * *

UNITED STATES PATENT AND TRADEMARK OFFICE
CERTIFICATE OF CORRECTION

PATENT NO. : 9,865,600 B2
APPLICATION NO. : 15/225964
DATED : January 9, 2018
INVENTOR(S) : Christopher Bower et al.

It is certified that error appears in the above-identified patent and that said Letters Patent is hereby corrected as shown below:

In the Claims

Column 22, Line 25 (Claim 8) please replace:
"The device"
With:
--The wafer--

Column 22, Line 28 (Claim 9) please replace:
"The device"
With:
--The wafer--

Column 22, Line 31 (Claim 10) please replace:
"The device"
With:
--The wafer--

Column 22, Line 34 (Claim 11) please replace:
"The device"
With:
--The wafer--

Column 22, Line 37 (Claim 12) please replace:
"The device"
With:
--The wafer--

Signed and Sealed this
Twenty-fourth Day of July, 2018

Andrei Iancu
*Director of the United States Patent and Trademark Office*

CERTIFICATE OF CORRECTION (continued)
U.S. Pat. No. 9,865,600 B2

Column 23, Line 3 (Claim 14) please replace:
"The device"
With:
--The method--

Column 23, Line 6 (Claim 15) please replace:
"The device"
With:
--The method--

Column 23, Line 9 (Claim 16) please replace:
"The device"
With:
--The method--

Column 23, Line 12 (Claim 17) please replace:
"The device"
With:
--The method--

Column 23, Line 15 (Claim 18) please replace:
"The device"
With:
--The method--